(12) United States Patent
Young et al.

(10) Patent No.: US 11,848,402 B2
(45) Date of Patent: Dec. 19, 2023

(54) LIGHT EMITTING DIODE DEVICES WITH MULTILAYER COMPOSITE FILM INCLUDING CURRENT SPREADING LAYER

(71) Applicant: Lumileds LLC, San Jose, CA (US)

(72) Inventors: Erik William Young, San Jose, CA (US); Rajat Sharma, San Jose, CA (US); Dennis Scott, Dublin, CA (US)

(73) Assignee: Lumileds LLC, San Jose, CA (US)

( * ) Notice: Subject to any disclaimer, the term of this patent is extended or adjusted under 35 U.S.C. 154(b) by 308 days.

(21) Appl. No.: 17/193,310

(22) Filed: Mar. 5, 2021

(65) Prior Publication Data

US 2021/0288212 A1 Sep. 16, 2021

Related U.S. Application Data

(60) Provisional application No. 62/987,975, filed on Mar. 11, 2020.

(51) Int. Cl.
*H01L 33/14* (2010.01)
*H01L 33/00* (2010.01)
(Continued)

(52) U.S. Cl.
CPC ............ *H01L 33/14* (2013.01); *H01L 27/156* (2013.01); *H01L 33/005* (2013.01); *H01L 33/62* (2013.01); *H01L 2933/0066* (2013.01)

(58) Field of Classification Search
CPC ..... H01L 33/14; H01L 27/156; H01L 33/005; H01L 33/62; H01L 2933/0066; H01L 33/20; H01L 33/44; H01L 2933/0025
See application file for complete search history.

(56) References Cited

U.S. PATENT DOCUMENTS 6,410,942 B1 6/2002 Thibeault et al.
6,657,236 B1 12/2003 Thibeault et al.
(Continued)

FOREIGN PATENT DOCUMENTS

DE 102010051286 A1 5/2012
DE 102012109460 A1 4/2014
(Continued)

OTHER PUBLICATIONS

PCT International Search Report and Written Opinion in PCT/US2021/021300 dated Jun. 30, 2021, 10 pages.
(Continued)

*Primary Examiner* — Ratisha Mehta
(74) *Attorney, Agent, or Firm* — Servilla Whitney LLC

(57) ABSTRACT

Described are light emitting diode (LED) devices comprising a plurality of mesas defining pixels, each of the mesas comprising semiconductor layers, an N-contact material in a space between each of the plurality of mesas, a dielectric material which insulates sidewalls of the P-type layer and the active region from the metal. A multilayer composite film is on the P-type layer, the multilayer composite film comprising: a current spreading layer on the P-type layer, the current spreading layer having a first portion and a second portion; a dielectric layer on the second portion of the current spreading layer; a via opening defined by sidewalls in the dielectric layer and the first portion of the current spreading layer; and a P-contact layer in the via opening on the first portion of the current spreading layer, the sidewalls in the dielectric layer, and on at least a portion of the dielectric layer.

14 Claims, 16 Drawing Sheets

(51) Int. Cl.
    *H01L 27/15*     (2006.01)
    *H01L 33/62*     (2010.01)

(56) References Cited

U.S. PATENT DOCUMENTS

| | | | |
|---|---|---|---|
| 6,821,804 | B2 | 11/2004 | Thibeault et al. |
| 7,943,406 | B2 | 5/2011 | Slater, Jr. et al. |
| 8,222,811 | B2 | 7/2012 | Vaufrey et al. |
| 8,258,044 | B2 | 9/2012 | Brun et al. |
| 8,487,340 | B2 | 7/2013 | Gilet et al. |
| 8,638,032 | B2 | 1/2014 | Maindron et al. |
| 8,647,957 | B2 | 2/2014 | Borowik et al. |
| 8,697,548 | B2 | 4/2014 | Borowik et al. |
| 8,698,396 | B2 | 4/2014 | Maindron et al. |
| 8,754,426 | B2 | 6/2014 | Marx et al. |
| 8,890,111 | B2 | 11/2014 | Templier et al. |
| 8,969,900 | B2 | 3/2015 | Sabathil et al. |
| 9,093,607 | B2 | 7/2015 | Gilet et al. |
| 9,109,296 | B2 | 8/2015 | Metaye et al. |
| 9,112,112 | B2 | 8/2015 | Do et al. |
| 9,192,290 | B2 | 11/2015 | Spinnler et al. |
| 9,209,366 | B2 | 12/2015 | Maindron et al. |
| 9,263,633 | B2 | 2/2016 | Gilet et al. |
| 9,396,970 | B2 | 7/2016 | Gillot et al. |
| 9,422,628 | B2 | 8/2016 | Simonato et al. |
| 9,496,465 | B2 | 11/2016 | Sugimoto et al. |
| 9,507,204 | B2 | 11/2016 | Pelka et al. |
| 9,601,542 | B2 | 3/2017 | Robin et al. |
| 9,722,160 | B2 | 8/2017 | Nakabayashi |
| 9,768,350 | B2 | 9/2017 | Bavencove et al. |
| 9,859,330 | B2 | 1/2018 | Von Malm et al. |
| 9,887,184 | B2 | 2/2018 | Takeya et al. |
| 9,945,526 | B2 | 4/2018 | Singer et al. |
| 9,978,727 | B2 | 5/2018 | Takeya et al. |
| 9,997,688 | B2 | 6/2018 | Takeya et al. |
| 10,002,928 | B1 | 6/2018 | Raring et al. |
| 10,018,325 | B2 | 7/2018 | Kim et al. |
| 10,050,026 | B2 | 8/2018 | Takeya et al. |
| 10,068,884 | B2 | 9/2018 | Takeya et al. |
| 10,145,518 | B2 | 12/2018 | Do et al. |
| 10,468,436 | B2 | 11/2019 | Robin et al. |
| 10,811,460 | B2 | 10/2020 | Dimitropoulos et al. |
| 10,923,628 | B2 | 2/2021 | Dimitropoulos et al. |
| 10,964,845 | B2 | 3/2021 | Dimitropoulos et al. |
| 2002/0139987 | A1 | 10/2002 | Collins, III et al. |
| 2006/0091786 | A1 | 5/2006 | Chakraborty et al. |
| 2007/0206130 | A1 | 9/2007 | Wuu et al. |
| 2008/0099787 | A1 | 5/2008 | Coolbaugh et al. |
| 2008/0173884 | A1 | 7/2008 | Chitnis et al. |
| 2008/0179602 | A1 | 7/2008 | Negley et al. |
| 2010/0078656 | A1 | 4/2010 | Seo et al. |
| 2011/0151607 | A1 | 6/2011 | Landis et al. |
| 2011/0287606 | A1 | 11/2011 | Brun et al. |
| 2012/0050694 | A1 | 3/2012 | Huang et al. |
| 2012/0091481 | A1 | 4/2012 | Sekine et al. |
| 2012/0205614 | A1 | 8/2012 | Templier et al. |
| 2013/0020115 | A1 | 1/2013 | Mataye et al. |
| 2013/0112945 | A1 | 5/2013 | Gilet et al. |
| 2013/0256708 | A1 | 10/2013 | Jin et al. |
| 2014/0077156 | A1 | 3/2014 | Bavencove et al. |
| 2014/0094878 | A1 | 4/2014 | Gossler et al. |
| 2014/0138719 | A1 | 5/2014 | Maindron et al. |
| 2014/0159091 | A1 | 6/2014 | Hon et al. |
| 2015/0118544 | A1 | 4/2015 | Oukassi |
| 2015/0144590 | A1 | 5/2015 | Simonato et al. |
| 2015/0228873 | A1 | 8/2015 | Gebuhr et al. |
| 2015/0280060 | A1 | 10/2015 | Gilet et al. |
| 2015/0311415 | A1 | 10/2015 | Song et al. |
| 2015/0349117 | A1* | 12/2015 | Chu ............... H01L 29/7786 438/270 |
| 2015/0357516 | A1 | 12/2015 | Sundgren et al. |
| 2015/0380461 | A1 | 12/2015 | Robin et al. |
| 2016/0079565 | A1 | 3/2016 | Maindron et al. |
| 2016/0190400 | A1 | 6/2016 | Jung et al. |
| 2016/0218240 | A1 | 7/2016 | Bouvier et al. |
| 2016/0293811 | A1 | 10/2016 | Hussell et al. |
| 2016/0336483 | A1 | 11/2016 | Shatalov et al. |
| 2017/0062661 | A1 | 3/2017 | Otto |
| 2017/0080457 | A1 | 3/2017 | Eymery et al. |
| 2017/0098746 | A1 | 4/2017 | Bergmann et al. |
| 2017/0137645 | A1 | 5/2017 | Manceau et al. |
| 2017/0186612 | A1 | 6/2017 | Almadori et al. |
| 2017/0243860 | A1 | 8/2017 | Hong et al. |
| 2017/0288088 | A1* | 10/2017 | Won Cheol ............ H01L 33/44 |
| 2017/0293065 | A1 | 10/2017 | Kim |
| 2017/0294418 | A1 | 10/2017 | Edmond et al. |
| 2017/0309794 | A1 | 10/2017 | Von Malm |
| 2017/0358563 | A1 | 12/2017 | Cho et al. |
| 2017/0358724 | A1 | 12/2017 | Shichijo et al. |
| 2018/0017939 | A1 | 1/2018 | Allier et al. |
| 2018/0019369 | A1 | 1/2018 | Cho et al. |
| 2018/0019373 | A1 | 1/2018 | Lehnhardt et al. |
| 2018/0061316 | A1 | 3/2018 | Shin et al. |
| 2018/0074372 | A1 | 3/2018 | Takeya et al. |
| 2018/0090540 | A1 | 3/2018 | Von Malm et al. |
| 2018/0138157 | A1 | 5/2018 | Im et al. |
| 2018/0145059 | A1 | 5/2018 | Welch et al. |
| 2018/0149328 | A1 | 5/2018 | Cho et al. |
| 2018/0156406 | A1 | 6/2018 | Feil et al. |
| 2018/0166470 | A1 | 6/2018 | Chae |
| 2018/0174519 | A1 | 6/2018 | Kim et al. |
| 2018/0174931 | A1 | 6/2018 | Henley |
| 2018/0188866 | A1* | 7/2018 | Heo ................ G06F 3/0445 |
| 2018/0210282 | A1 | 7/2018 | Song et al. |
| 2018/0238511 | A1 | 8/2018 | Hartmann et al. |
| 2018/0259137 | A1 | 9/2018 | Lee et al. |
| 2018/0259570 | A1 | 9/2018 | Henley |
| 2018/0272605 | A1 | 9/2018 | Gmeinsieser et al. |
| 2018/0283642 | A1 | 10/2018 | Liao et al. |
| 2018/0297510 | A1 | 10/2018 | Fiederling et al. |
| 2018/0308420 | A1 | 10/2018 | Shin et al. |
| 2018/0315738 | A1 | 11/2018 | Bono et al. |
| 2018/0331251 | A1 | 11/2018 | Scholz et al. |
| 2018/0339643 | A1 | 11/2018 | Kim |
| 2018/0339644 | A1 | 11/2018 | Kim |
| 2018/0354406 | A1 | 12/2018 | Park |
| 2019/0189682 | A1 | 6/2019 | Young et al. |
| 2019/0189879 | A1 | 6/2019 | Tandon et al. |
| 2020/0052175 | A1 | 2/2020 | Oh et al. |
| 2020/0403377 | A1* | 12/2020 | Wu ................ H01S 5/32316 |
| 2020/0412095 | A1* | 12/2020 | Yanagisawa ........ H01S 5/04256 |
| 2021/0119105 | A1* | 4/2021 | Seghizzi ............... H10N 30/03 |
| 2021/0408341 | A1* | 12/2021 | Kishimoto ........... H01L 33/483 |

FOREIGN PATENT DOCUMENTS

| | | |
|---|---|---|
| DE | 102014112551 A1 | 3/2016 |
| EP | 1378949 A1 | 1/2004 |
| EP | 2027608 A1 | 2/2009 |
| EP | 2203939 A1 | 7/2010 |
| EP | 2211387 A2 | 7/2010 |
| EP | 2339658 A2 | 6/2011 |
| EP | 2491591 A1 | 8/2012 |
| EP | 2499958 A1 | 9/2012 |
| EP | 2521161 A1 | 11/2012 |
| EP | 2521162 A1 | 11/2012 |
| EP | 2553149 A1 | 2/2013 |
| EP | 2617069 A1 | 7/2013 |
| EP | 2674516 A1 | 12/2013 |
| EP | 2855744 B1 | 5/2016 |
| EP | 3053199 A1 | 8/2016 |
| EP | 3144272 A1 | 3/2017 |
| EP | 2006921 B1 | 12/2018 |
| EP | 3410002 A1 | 12/2018 |
| EP | 3410003 A1 | 12/2018 |
| EP | 2710634 B1 | 10/2020 |
| FR | 2952366 A1 | 5/2011 |
| FR | 2964796 A1 | 3/2012 |
| FR | 2969995 A1 | 7/2012 |
| FR | 2972815 A1 | 9/2012 |
| FR | 2974940 A1 | 11/2012 |
| FR | 2974941 A1 | 11/2012 |
| FR | 2975532 A1 | 11/2012 |
| FR | 2991342 A1 | 12/2013 |

(56) References Cited

FOREIGN PATENT DOCUMENTS

| | | | |
|---|---|---|---|
| FR | 2991999 A1 | 12/2013 |
| FR | 2998090 A1 | 5/2014 |
| FR | 3011383 A1 | 4/2015 |
| FR | 3041274 A1 | 3/2017 |
| FR | 3046155 A1 | 6/2017 |
| FR | 3052915 A1 | 12/2017 |
| JP | 2016066765 A | 4/2016 |
| KR | 20130060189 A | 6/2013 |
| KR | 20140118466 A | 10/2014 |
| KR | 20170018687 A | 2/2017 |
| KR | 20180010670 A | 1/2018 |
| KR | 20180114413 A | 10/2018 |
| TW | 201417339 A | 5/2014 |
| TW | 201620163 A | 6/2016 |
| WO | 2006138465 A2 | 12/2006 |
| WO | 2011045289 A1 | 4/2011 |
| WO | 2011048318 A1 | 4/2011 |
| WO | 2012035243 A1 | 3/2012 |
| WO | 2012156620 A2 | 11/2012 |
| WO | 2013182969 A1 | 12/2013 |
| WO | 2015044620 A1 | 4/2015 |
| WO | 2016079505 A1 | 5/2016 |
| WO | 2017068029 A1 | 4/2017 |
| WO | 2017089676 A1 | 6/2017 |
| WO | 2017102708 A1 | 6/2017 |
| WO | WO2017184686 A | 10/2017 |
| WO | 2017216445 A1 | 12/2017 |
| WO | 2018091657 A1 | 5/2018 |
| WO | 2018139866 A1 | 8/2018 |
| WO | 2018143682 A1 | 8/2018 |
| WO | 2018159977 A1 | 9/2018 |
| WO | 2018169243 A1 | 9/2018 |
| WO | 2019092357 A1 | 5/2019 |
| WO | 2019126539 A | 6/2019 |

OTHER PUBLICATIONS

PCT International Search Report and Written Opinion in PCT/US2021/021305 dated Jun. 29, 2021, 10 pages.

* cited by examiner

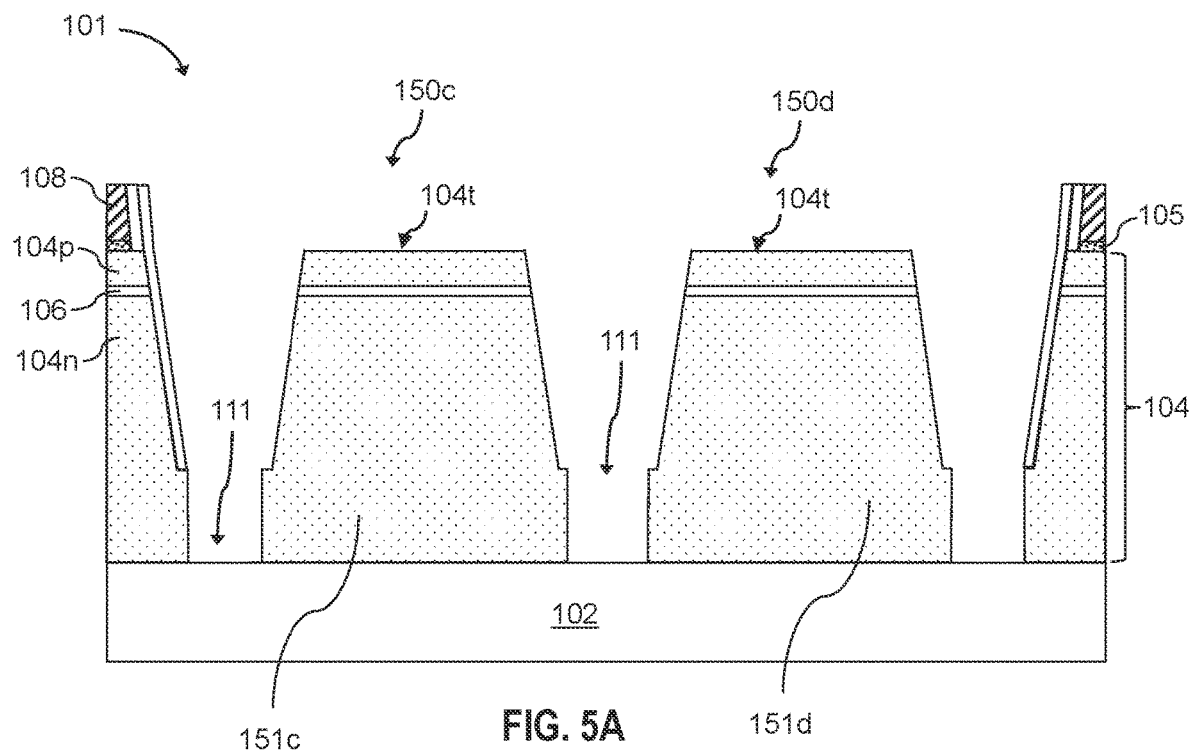

LIGHT EMITTING DIODE DEVICES WITH MULTILAYER COMPOSITE FILM INCLUDING CURRENT SPREADING LAYER

CROSS-REFERENCE TO RELATED APPLICATION

This application claims priority to U.S. Provisional Application No. 62/987,975, filed Mar. 11, 2020, the entire disclosure of which is hereby incorporated by reference herein.

TECHNICAL FIELD

Embodiments of the disclosure generally relate to light emitting diode (LED) devices and methods of manufacturing the same. More particularly, embodiments are directed to light emitting diode devices that include a multilayer composite film including a current spreading layer.

BACKGROUND

A light emitting diode (LED) is a semiconductor light source that emits visible light when current flows through it. LEDs combine a P-type semiconductor with an N-type semiconductor. LEDs commonly use a III-V group compound semiconductor. A III-V group compound semiconductor provides stable operation at a higher temperature than devices that use other semiconductors. The III-V group compound is typically formed on a substrate formed of sapphire aluminum oxide ($Al_2O_3$) or silicon carbide (SiC).

Various emerging display applications, including wearable devices, head-mounted, and large-area displays require miniaturized chips composed of arrays of microLEDs (μLEDs or uLEDs) with a high density having a lateral dimension down to less than 100 μm×100 μm. MicroLEDs (uLEDs) typically have dimensions of about 50 μm in diameter or width and smaller that are used to in the manufacture of color displays by aligning in close proximity microLEDs comprising red, blue and green wavelengths. Generally, two approaches have been utilized to assemble displays constructed from individual microLED dies. The first is a pick-and-place approach includes: picking up, aligning, and then attaching each individual blue, green and red wavelength microLED onto a backplane, followed by electrically connecting the backplane to a driver integrated circuit. Due to the small size of each microLED, this assembly sequence is slow and subject to manufacturing errors. Furthermore, as the die size decreases to satisfy increasing resolution requirements of displays, larger and larger numbers of die must be transferred at each pick and place operation to populate a display of required dimensions. A second approach is bonding a group of LEDs, e.g., a monolithic die or array or matrix, to a backplane, which eliminates the handling of individual LEDs associated with pick-and-place. There is a need, therefore, to develop methods to efficiently prepare groups of LEDs, which may be used thereafter for bonding to an LED backplane.

SUMMARY

Embodiments of the disclosure are directed to light emitting diode (LED) devices comprising: a plurality of mesas defining pixels, each of the mesas comprising semiconductor layers, the semiconductor layers including an N-type layer, an active region, and a P-type layer, each of the mesas having a height less than or equal to their width; an N-contact material in a space between each of the mesas, the N-contact material providing optical isolation between each of the mesas, and electrically contacting the N-type layer of each of the mesas along sidewalls of the N-type layers; a dielectric material which insulates sidewalls of the P-type layer and the active region from the N-contact material; and a multilayer composite film on the P-type layer, the multilayer composite film comprising: a current spreading layer on the P-type layer, the current spreading layer having a first portion and a second portion; a dielectric layer on the second portion of the current spreading layer; a via opening defined by sidewalls in the dielectric layer and the first portion of the current spreading layer; and a P-contact layer in the via opening on the first portion of the current spreading layer, the sidewalls in the dielectric layer, and on at least a portion of the dielectric layer.

Additional embodiments are directed to light emitting diode (LED) devices comprising: a plurality of mesas defining pixels, each of the mesas comprising semiconductor layers, the semiconductor layers including an N-type layer, an active region, and a P-type layer, each of the mesas having a height less than or equal to their width; an N-contact material in a space between each of the mesas, the N-contact material providing optical isolation between each of the mesas, and electrically contacting the N-type layer of each of the mesas along sidewalls of the N-type layers; a dielectric material which insulates sidewalls of the P-type layer and the active region from the N-contact material; a multilayer composite film on the P-type layer, the multilayer composite film comprising: a current spreading layer having a first portion and a second portion directly on the P-type layer, a dielectric layer on the second portion of the current spreading layer, the dielectric layer comprising sidewalls that with the first portion of the current spreading layer defining a via opening, and a P-contact layer conformal to the dielectric layer and the via opening; a hard mask layer above the P-contact layer that is above the second portion of the current spreading layer, the hard mask layer comprising sidewalls defining a hard mask opening; a liner layer conformally-deposited in the hard mask opening above the P-contact layer that is above the first portion of the current spreading layer and on the sidewalls of the hard mask layer; a P-metal material plug on the liner layer; a passivation layer on the hard mask layer; and an under bump metallization layer on the passivation layer.

Further embodiments are directed to a method of manufacturing a light emitting diode (LED) device comprising: depositing a plurality of semiconductor layers including an N-type layer, an active region, and a P-type layer on a substrate; etching a portion of the semiconductor layers to form trenches and plurality of mesas defining pixels, each of the mesas comprising the semiconductor layers and each of the mesas having a height less than or equal to their width; depositing a first dielectric material in the trenches; depositing an N-contact material in a space between each of the mesas, the N-contact material providing optical isolation between each of the mesas, and electrically contacting the N-type layer of each of the mesas along sidewalls of the N-type layers, wherein the dielectric material insulates sidewalls of the P-type layer and the active region from the N-contact material; and depositing a multilayer composite film on the P-type layer, the multilayer composite film comprising a current spreading layer on the P-type layer, the current spreading layer having a first portion and a second portion; a dielectric layer on the second portion of the current spreading layer; a via opening defined by sidewalls in the dielectric layer and the first portion of the current spreading layer; and a P-contact layer in the via opening on: the first portion of the current spreading layer, the sidewalls in the dielectric layer, and at least a portion of the dielectric layer.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments. The embodiments as described herein are illustrated by way of example and not limitation in the figures of the accompanying drawings in which like references indicate similar elements.

FIG. 1O illustrates a cross-sectional view of a finished device a step in the manufacture of a LED device according to one or more embodiments;

FIG. 5A illustrates a variation of FIG. 1G for an embodiment to make a pixelated common cathode.

To facilitate understanding, identical reference numerals have been used, where possible, to designate identical elements that are common to the figures. The figures are not drawn to scale. For example, the heights and widths of the mesas are not drawn to scale.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

The term "substrate" as used herein according to one or more embodiments refers to a structure, intermediate or final, having a surface, or portion of a surface, upon which a process acts. In addition, reference to a substrate in some embodiments also refers to only a portion of the substrate, unless the context clearly indicates otherwise. Further, reference to depositing on a substrate according to some embodiments includes depositing on a bare substrate, or on a substrate with one or more films or features or materials deposited or formed thereon.

In one or more embodiments, the "substrate" means any substrate or material surface formed on a substrate upon which film processing is performed during a fabrication process. In exemplary embodiments, a substrate surface on which processing is performed includes materials such as silicon, silicon oxide, silicon on insulator (SOI), strained silicon, amorphous silicon, doped silicon, carbon doped silicon oxides, germanium, gallium arsenide, glass, sapphire, and any other suitable materials such as metals, metal nitrides, III-nitrides (e.g., GaN, AlN, InN and alloys), metal alloys, and other conductive materials, depending on the application. Substrates include, without limitation, light emitting diode (LED) devices. Substrates in some embodiments are exposed to a pretreatment process to polish, etch, reduce, oxidize, hydroxylate, anneal, UV cure, e-beam cure and/or bake the substrate surface. In addition to film processing directly on the surface of the substrate itself, in some embodiments, any of the film processing steps disclosed are also performed on an underlayer formed on the substrate, and the term "substrate surface" is intended to include such underlayer as the context indicates. Thus for example, where a film/layer or partial film/layer has been deposited onto a substrate surface, the exposed surface of the newly deposited film/layer becomes the substrate surface.

The term "wafer" and "substrate" will be used interchangeably in the instant disclosure. Thus, as used herein, a wafer serves as the substrate for the formation of the LED devices described herein.

Reference to a micro-LED (uLED) means a light emitting diode having one or more characteristic dimensions (e.g., height, width, depth, thickness, etc. dimensions) of less than 100 micrometers. In one or embodiments, one or more dimensions of height, width, depth, thickness have values in a range of 2 to 25 micrometers.

Figure 1A:
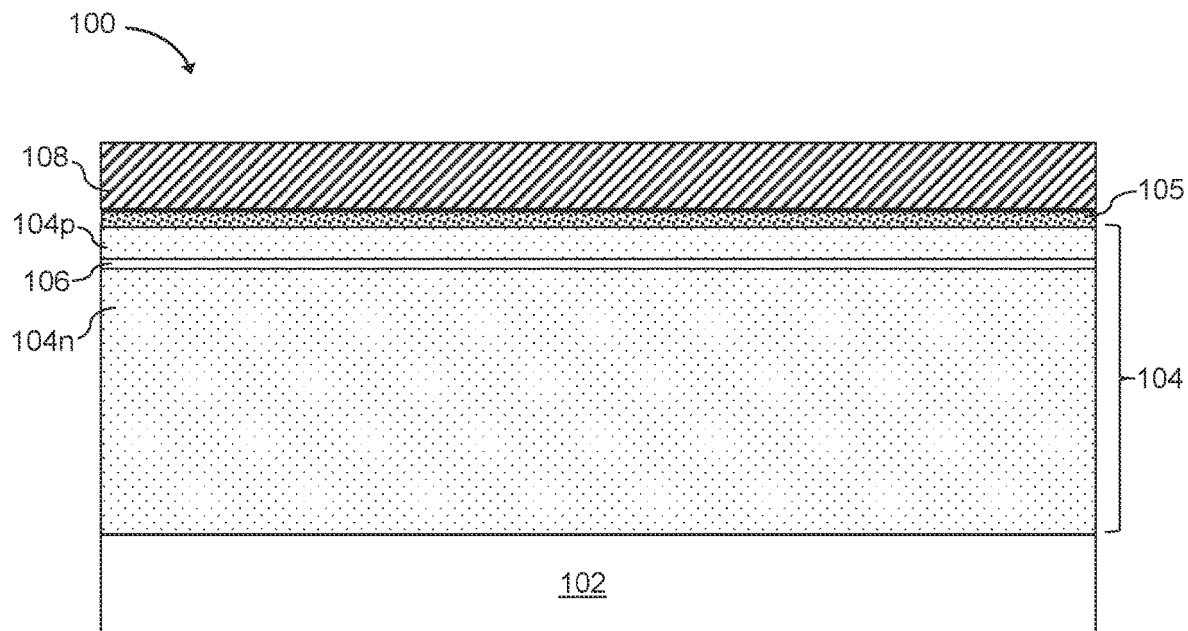
FIG. 1A illustrates a cross-sectional view of a stack of semiconductor layers, a metal layer (e.g., a p-contact layer), and a dielectric layer (e.g., a hard mask layer) deposited on a substrate according to one or more embodiments.

FIG. 1A is a cross-sectional view of a stack of semiconductor layers, a metal layer (e.g., a p-contact layer), and a dielectric layer (e.g., a hard mask layer) deposited on a substrate during a step in the manufacture of a LED device according to one or more embodiments. With reference to FIG. 1A, semiconductor layers 104 are grown on a substrate 102. The semiconductor layers 104 according to one or more embodiments comprise epitaxial layers, III-nitride layers or epitaxial III-nitride layers.

The substrate may be any substrate known to one of skill in the art. In one or more embodiments, the substrate comprises one or more of sapphire, silicon carbide, silicon (Si), quartz, magnesium oxide (MgO), zinc oxide (ZnO), spinel, and the like. In one or more embodiments, the substrate is not patterned prior to the growth of the epitaxial layer(s). Thus, in some embodiments, the substrate is not patterned and can be considered to be flat or substantially flat. In other embodiments, the substrate is patterned, e.g. patterned sapphire substrate (PSS).

In one or more embodiments, the semiconductor layers 104 comprise a III-nitride material, and in specific embodiments epitaxial III-nitride material. In some embodiments, the III-nitride material comprises one or more of gallium (Ga), aluminum (Al), and indium (In). Thus, in some embodiments, the semiconductor layers 104 comprises one or more of gallium nitride (GaN), aluminum nitride (AlN), indium nitride (InN), aluminum gallium nitride (AlGaN), indium gallium nitride (InGaN), indium aluminum nitride (InAlN), aluminum indium gallium nitride (AlInGaN) and the like. In one or more specific embodiments, the semiconductor layers 104 comprises a p-type layer, an active region, and an n-type layer. In one or more embodiments, the semiconductor layers 104 comprise a III-nitride material, and in specific embodiments epitaxial III-nitride material. In some embodiments, the III-nitride material comprises one or more of gallium (Ga), aluminum (Al), and indium (In). Thus, in some embodiments, the semiconductor layers 104 comprises one or more of gallium nitride (GaN), aluminum nitride (AlN), indium nitride (InN), aluminum gallium nitride (AlGaN), indium gallium nitride (InGaN), indium aluminum nitride (InAlN), aluminum indium gallium nitride (AlInGaN) and the like. In one or more specific embodiments, the semiconductor layers 104 comprises a p-type layer, an active region, and an n-type layer.

In one or more embodiments, the substrate 102 is placed in a metalorganic vapor-phase epitaxy (MOVPE) reactor for epitaxy of LED device layers to grow the semiconductor layers 104.

In one or more embodiments, the semiconductor layers 104 comprise a stack of undoped III-nitride material and doped III-nitride material. The III-nitride materials may be doped with one or more of silicon (Si), oxygen (O), boron (B), phosphorus (P), germanium (Ge), manganese (Mn), or magnesium (Mg) depending upon whether p-type or n-type III-nitride material is needed. In specific embodiments, the semiconductor layers 104 comprise an n-type layer 104n, an active region 106 and a p-type layer 104p.

In one or more embodiments, the semiconductor layers 104 have a combined thickness in a range of from about 2 μm to about 10 μm, including a range of from about 2 μm to about 9 μm, 2 μm to about 8 μm, 2 μm to about 7 μm, 2 μm to about 6 μm, 2 μm to about 5 μm, 2 μm to about 4 μm, 2 μm to about 3 μm, 3 μm to about 10 μm, 3 μm to about 9 μm, 3 μm to about 8 μm, 3 μm to about 7 μm, 3 μm to about 6 μm, 3 μm to about 5 μm, 3 μm to about 4 μm, 4 μm to about 10 μm, 4 μm to about 9 μm, 4 μm to about 8 μm, 4 μm to about 7 μm, 4 μm to about 6 μm, 4 μm to about 5 μm, 5 μm to about 10 μm, 5 μm to about 9 μm, 5 μm to about 8 μm, 5 μm to about 7 μm, 5 μm to about 6 μm, 6 μm to about 10 μm, 6 μm to about 9 μm, 6 μm to about 8 μm, 6 μm to about 7 μm, 7 μm to about 10 μm, 7 μm to about 9 μm, or 7 μm to about 8 μm.

In one or more embodiments, an active region 106 is formed between the n-type layer 104n and the p-type layer 104p. The active region 106 may comprise any appropriate materials known to one of skill in the art. In one or more embodiments, the active region 106 is comprised of a III-nitride material multiple quantum wells (MQW), and a III-nitride electron blocking layer.

In one or more embodiments, a P-contact layer 105 and a hard mask layer 108 are deposited on the p-type layer 104p. As shown, the P-contact layer is deposited on the p-type layer 104p and the hard mask layer 108 is on the P-contact layer. In some embodiments, the P-contact layer 105 is deposited directly on the p-type layer 104p. In other embodiments, not illustrated, there may be one or more additional layer between the p-type layer 104p and the P-contact layer 105. In some embodiments, the hard mask layer 108 is deposited directly on the P-contact layer 105. In other embodiments, not illustrated, there may be one or more additional layers between the hard mask layer 108 and the P-contact layer 105. The hard mask layer 108 and the P-contact layer 105 may be deposited by any appropriate technique known to the skilled artisan. In one or more embodiments, the hard mask layer 108 and P-contact layer 105 are deposited by one or more of sputter deposition, atomic layer deposition (ALD), chemical vapor deposition (CVD), physical vapor deposition (PVD), plasma enhanced atomic layer deposition (PEALD), and plasma enhanced chemical vapor deposition (PECVD).

"Sputter deposition" as used herein refers to a physical vapor deposition (PVD) method of thin film deposition by sputtering. In sputter deposition, a material, e.g. a metal, is ejected from a target that is a source onto a substrate. The technique is based on ion bombardment of a source material, the target. Ion bombardment results in a vapor due to a purely physical process, i.e., the sputtering of the target material.

As used according to some embodiments herein, "atomic layer deposition" (ALD) or "cyclical deposition" refers to a vapor phase technique used to deposit thin films on a substrate surface. The process of ALD involves the surface of a substrate, or a portion of substrate, being exposed to alternating precursors, i.e. two or more reactive compounds, to deposit a layer of material on the substrate surface. When the substrate is exposed to the alternating precursors, the precursors are introduced sequentially or simultaneously. The precursors are introduced into a reaction zone of a processing chamber, and the substrate, or portion of the substrate, is exposed separately to the precursors.

As used herein according to some embodiments, "chemical vapor deposition (CVD)" refers to a process in which films of materials are deposited from the vapor phase by decomposition of chemicals on a substrate surface. In CVD, a substrate surface is exposed to precursors and/or co-reagents simultaneous or substantially simultaneously. As used herein, "substantially simultaneously" refers to either co-flow or where there is overlap for a majority of exposures of the precursors.

As used herein according to some embodiments, "plasma enhanced atomic layer deposition (PEALD)" refers to a technique for depositing thin films on a substrate. In some examples of PEALD processes relative to thermal ALD processes, a material may be formed from the same chemical precursors, but at a higher deposition rate and a lower temperature. A PEALD process, in general, a reactant gas and a reactant plasma are sequentially introduced into a process chamber having a substrate in the chamber. The first reactant gas is pulsed in the process chamber and is adsorbed onto the substrate surface. Thereafter, the reactant plasma is pulsed into the process chamber and reacts with the first reactant gas to form a deposition material, e.g. a thin film on a substrate. Similarly to a thermal ALD process, a purge step maybe conducted between the delivery of each of the reactants.

As used herein according to one or more embodiments, "plasma enhanced chemical vapor deposition (PECVD)" refers to a technique for depositing thin films on a substrate. In a PECVD process, a source material, which is in gas or liquid phase, such as a gas-phase III-nitride material or a vapor of a liquid-phase III-nitride material that have been entrained in a carrier gas, is introduced into a PECVD chamber. A plasma-initiated gas is also introduced into the chamber. The creation of plasma in the chamber creates excited radicals. The excited radicals are chemically bound to the surface of a substrate positioned in the chamber, forming the desired film thereon.

In one or more embodiments, the hard mask layer 108 may be fabricated using materials and patterning techniques which are known in the art. In some embodiments, the hard mask layer 108 comprises a metallic or dielectric material. Suitable dielectric materials include, but are not limited to, silicon oxide (SiO), silicon nitride (SiN), silicon carbide (SiC), aluminum oxide ($AlO_x$), aluminum nitride (AlN) and combinations thereof. The skilled artisan will recognize that the use of formulas like SiO, to represent silicon oxide, does not imply any particular stoichiometric relationship between the elements. The formula merely identifies the primary elements of the film.

In one or more embodiments, the P-contact layer 105 may comprise any suitable metal known to one of skill in the art. In one or more embodiments, the P-contact layer 105 comprises silver (Ag).

Figure 1B:
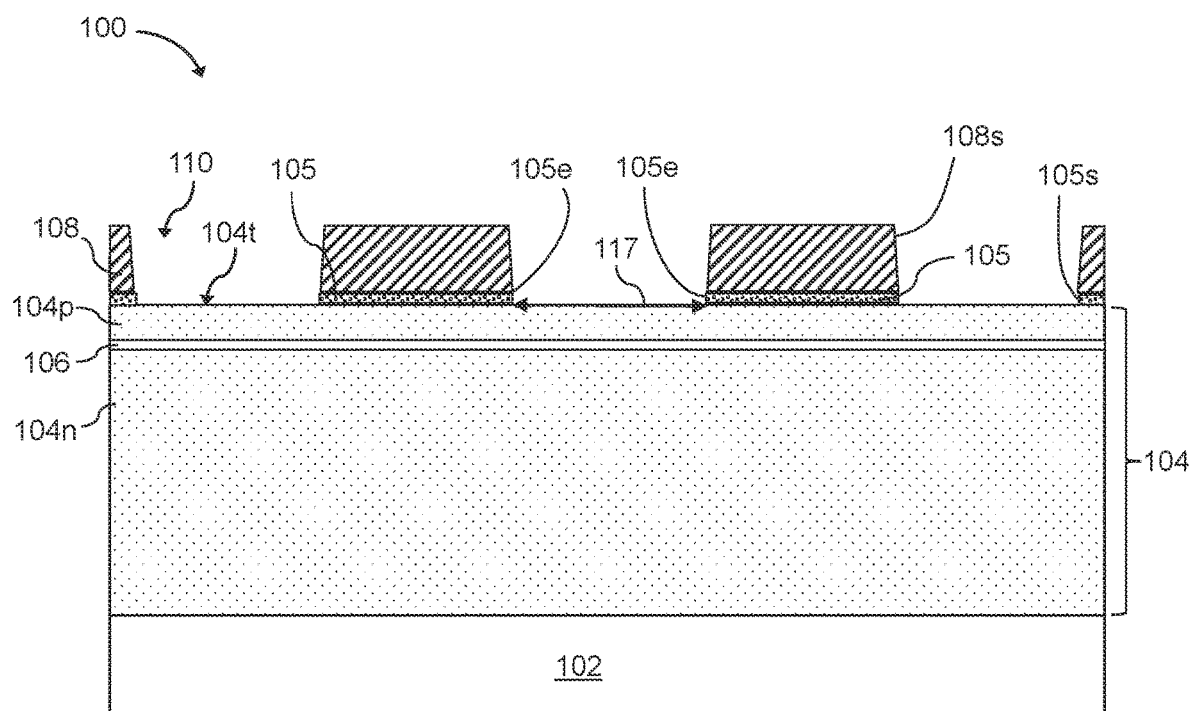
FIG. 1B illustrates a cross-sectional view of the stack after a step in the manufacture of a LED device according to one or more embodiments.

FIG. 1B is a cross-sectional view of the stack after a step in the manufacture of a LED device 100 according to one or more embodiments. With reference to FIG. 1B, the hard mask layer 108 and P-contact layer 105 are patterned to form at least one opening 110 in the hard mask layer 108 and P-contact layer 105, exposing a top surface 104t of the semiconductor layers 104 and sidewalls 108s, 105s of the hard mask layer 108 and P-contact layer 105, respectively.

In one or more embodiments, the hard mask layer 108 and P-contact layer 105 is patterned according to any appropriate patterning technique known to one of skill in the art. In one or more embodiments, the hard mask layer 108 and P-contact layer 105 are patterned by etching. According to one or more embodiments, conventional masking, wet etching and/or dry etching processes can be used to pattern the hard mask layer 108 and the P-contact layer 105.

In other embodiments, a pattern is transferred to the hard mask layer 108 and P-contact layer 105 using nanoimprint lithography. In one or more embodiments, the substrate 102 is etched in a reactive ion etching (RIE) tool using conditions that etch the hard mask layer 108 and P-contact layer 105 efficiently but etch the p-type layer 104p very slowly or not at all. In other words, the etching is selective to the hard mask layer 108 and P-contact layer 105 over the p-type layer 104p. In a patterning step, it is understood that masking techniques may be used to achieve a desired pattern.

Figure 1C:
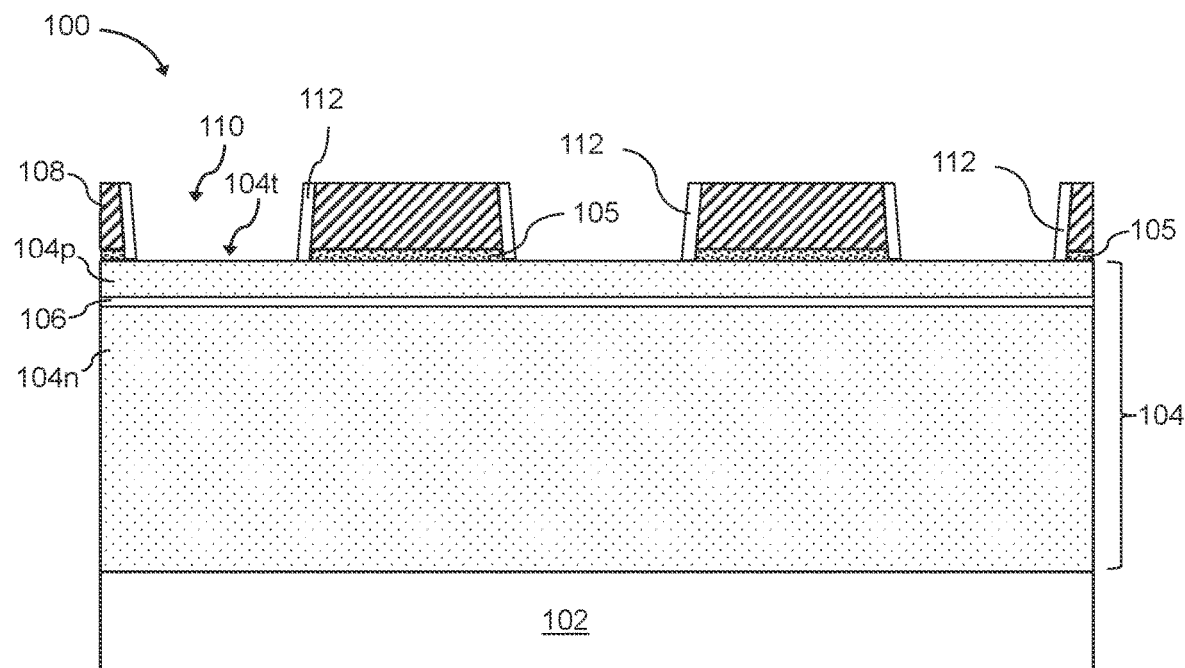
FIG. 1C illustrates a cross-sectional view of the stack after a step in the manufacture of a LED device according to one or more embodiments.

FIG. 1C is a cross-sectional view of the stack after a step in the manufacture of a LED device 100 according to one or more embodiments. With reference to FIG. 1C, inner spacers 112 are deposited on top surface 104t of the semiconductor layers 104 and the sidewalls 108s, 105s of the hard mask layer 108 and P-contact layer 105. The inner spacers 112 may comprise any appropriate material known to one of skill in the art. In one or more embodiments, the inner spacers 112 comprise a dielectric material. Deposition of the material that forms the inner spacers is typically done conformally to the substrate surface, followed by etching to achieve inner spacers on the sidewalls 108s, 105s, but not on the top surface 104b of the semiconductor layers 104.

As used herein, the term "dielectric" refers to an electrical insulator material that can be polarized by an applied electric field. In one or more embodiments, the inner spacers 112 include, but are not limited to, oxides, e.g., silicon oxide ($SiO_2$), aluminum oxide ($Al_2O_3$), nitrides, e.g., silicon nitride ($Si_3N_4$). In one or more embodiments, the dielectric inner spacers 112 comprise silicon nitride ($Si_3N_4$). In other embodiments, the inner spacers 112 comprise silicon oxide ($SiO_2$). In some embodiments, the inner spacers 112 composition is non-stoichiometric relative to the ideal molecular formula. For example, in some embodiments, the dielectric layer includes, but is not limited to, oxides (e.g., silicon oxide, aluminum oxide), nitrides (e.g., silicon nitride (SiN)), oxycarbides (e.g. silicon oxycarbide (SiOC)), and oxynitrocarbides (e.g. silicon oxycarbonitride (SiNCO)).

In some embodiments, the inner spacers 112 may be a distributed Bragg reflector (DBR). As used herein, a "distributed Bragg reflector" refers to a structure (e.g. a mirror) formed from a multilayer stack of alternating thin film materials with varying refractive index, for example high-index and low-index films.

In one or more embodiments, the inner spacers 112 are deposited by one or more of sputter deposition, atomic layer deposition (ALD), chemical vapor deposition (CVD), physical vapor deposition (PVD), plasma enhanced atomic layer deposition (PEALD), and plasma enhanced chemical vapor deposition (PECVD).

In one or more embodiments, the inner spacers 112 have a thickness in a range of from about 200 nm to about 1 μm, for example, about 300 nm to about 1 μm, about 400 nm to about 1 μm, about 500 nm to about 1 μm, about 600 nm to about 1 μm, about 700 nm to about 1 μm, about 800 nm to about 1 μm, about 500 nm to about 1 μm, about 200 nm to about 900 nm, 300 nm to about 900 nm, about 400 nm to about 900 nm, about 500 nm to about 900 nm, about 600 nm to about 900 nm, about 700 nm to about 900 nm, about 800 nm to about 900 nm, about 200 nm to about 800 nm, 300 nm to about 800 nm, about 400 nm to about 800 nm, about 500 nm to about 800 nm, about 600 nm to about 800 nm, about 700 nm to about 800 nm, about 200 nm to about 700 nm, about 300 nm to about 700 nm, about 400 nm to about 700 nm, about 500 nm to about 700 nm, about 600 nm to about 700 nm, about 200 nm to about 600 nm, about 300 nm to about 600 nm, about 400 nm to about 600 nm, about 500 nm to about 600 nm, about 200 nm to about 500 nm, about 300 nm to about 500 nm, about 300 nm to about 400 nm, about 200 nm to about 400 nm, or about 300 nm to about 400 nm.

Figure 1D:
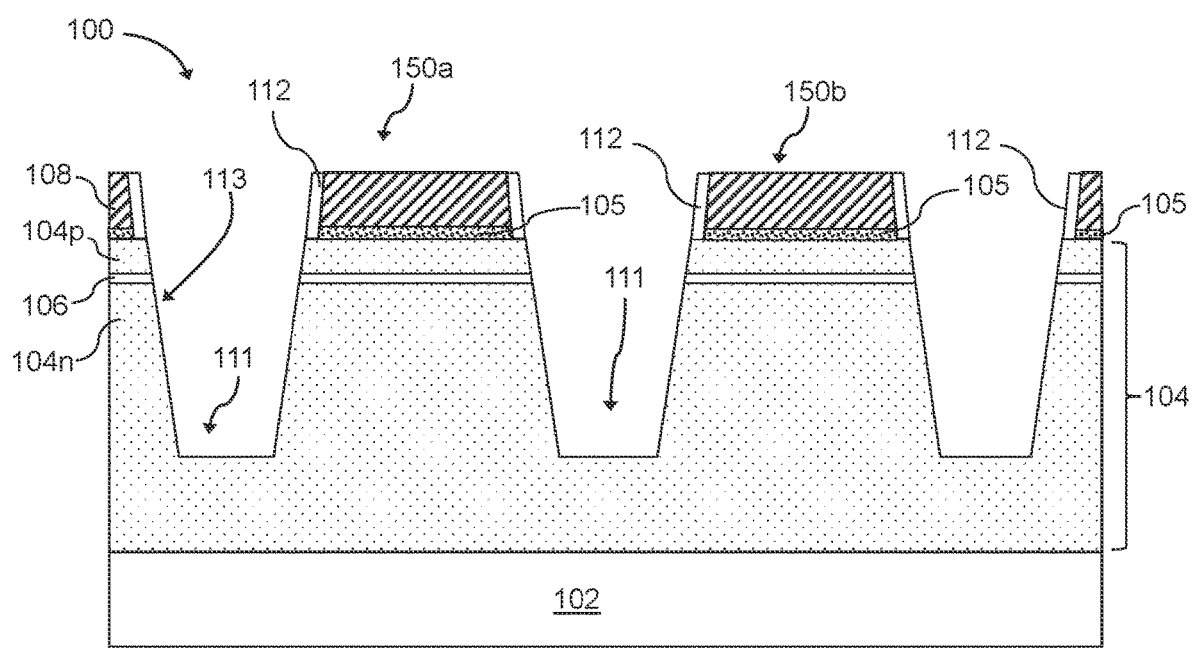
FIG. 1D illustrates a cross-sectional view of the stack after a step in the manufacture of a LED device according to one or more embodiments.

FIG. 1D is a cross-sectional view of the stack after a step in the manufacture of a LED device 100 according to one or more embodiments. With reference to FIG. 1D, the semiconductor layers 104 are etched to form at least one mesa, for example a first mesa 150a and a second mesa 150b. In the embodiment illustrated in FIG. 1D, the first mesa 150a and the second mesa 150b are separated by a trench 111, which will be referred to as a trench 111. Each trench 111 has sidewalls 113.

Figure 1E:
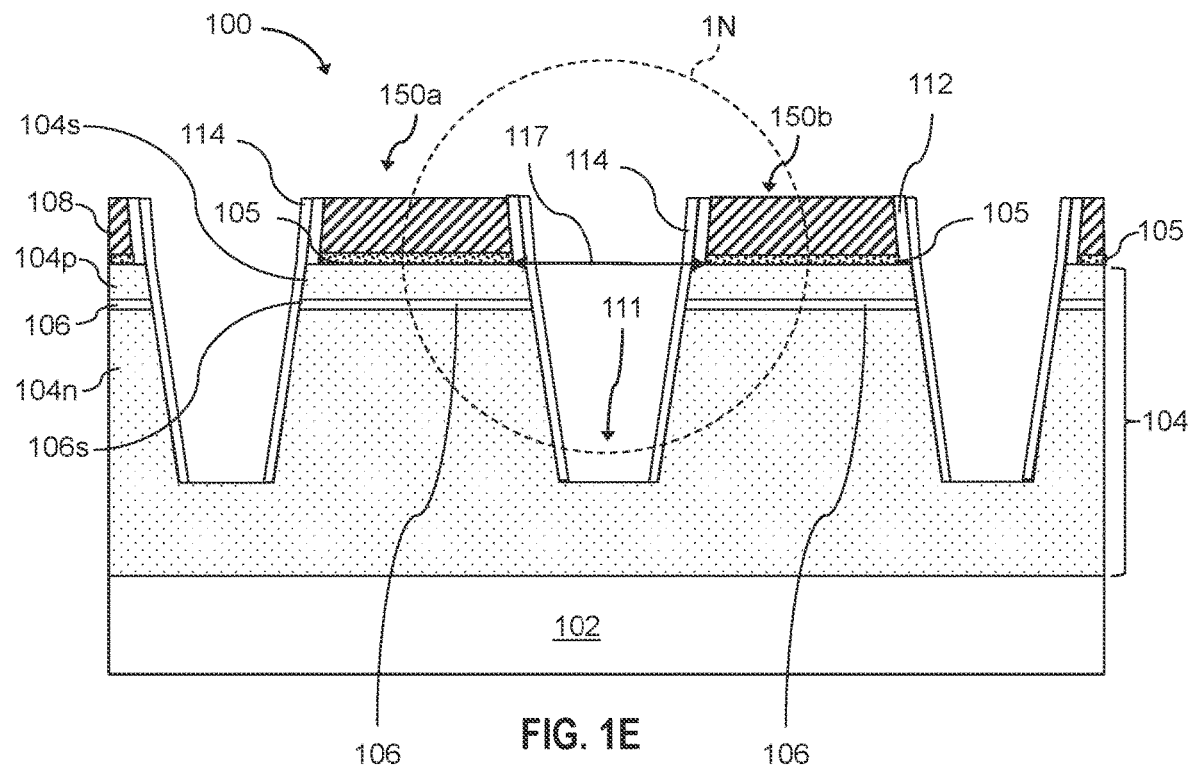
FIG. 1E illustrates a cross-sectional view of the stack after a step in the manufacture of a LED device according to one or more embodiments.

FIG. 1E is a cross-sectional view of the stack after a step in the manufacture of a LED device 100 according to one or more embodiments. With reference to FIG. 1E, outer spacers 114 are deposited on the sidewalls 113 of the trenches 111. The outer spacers 114 may comprise any appropriate material known to one of skill in the art. In one or more embodiments, the outer spacers 114 comprise a dielectric material. The dielectric material insulates the sidewalls of the P-type layer 104p (sidewall 104s) and the active region 106 (sidewall 106s) from metal that is deposited in the trenches 111, as described below with respect to FIG. 1I. Deposition of the material that forms the outer spacers is typically done conformally to the substrate surface, followed by etching to achieve outer spacers on the side walls of the trenches but not the bottom of the trench or top of the hard mask layer.

In one or more embodiments, the outer spacers 114 may be oxides, e.g., silicon oxide ($SiO_2$), aluminum oxide ($Al_2O_3$), nitrides, e.g., silicon nitride ($Si_3N_4$). In one or more embodiments, the outer spacer 114 comprises silicon nitride ($Si_3N_4$). In other embodiments, the outer spacer 114 comprises silicon oxide ($SiO_2$). In some embodiments, the outer spacers 114 may be a distributed Bragg reflector (DBR).

In one or more embodiments, the outer spacers 114 are deposited by one or more of sputter deposition, atomic layer deposition (ALD), chemical vapor deposition (CVD), physical vapor deposition (PVD), plasma enhanced atomic layer deposition (PEALD), and plasma enhanced chemical vapor deposition (PECVD).

Figure 1F:
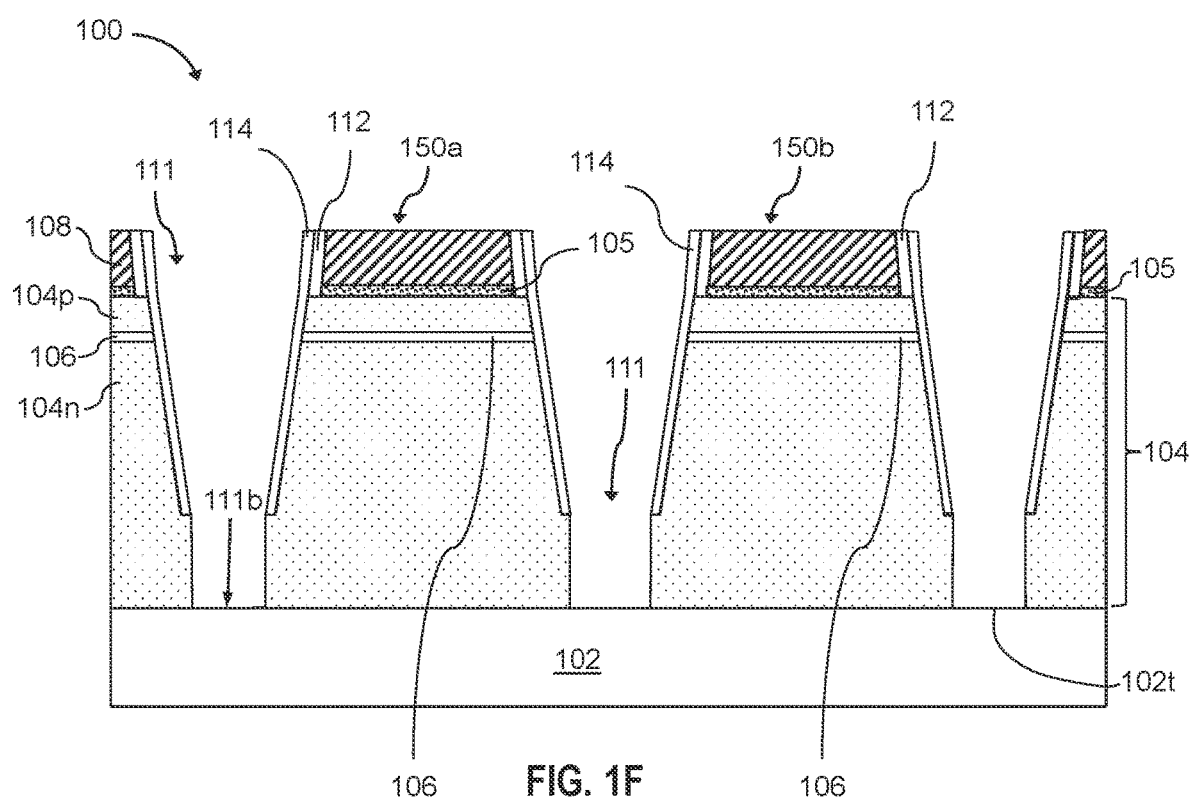
FIG. 1F illustrates a cross-sectional view of the stack after a step in the manufacture of a LED device according to one or more embodiments.
Figure 1G:
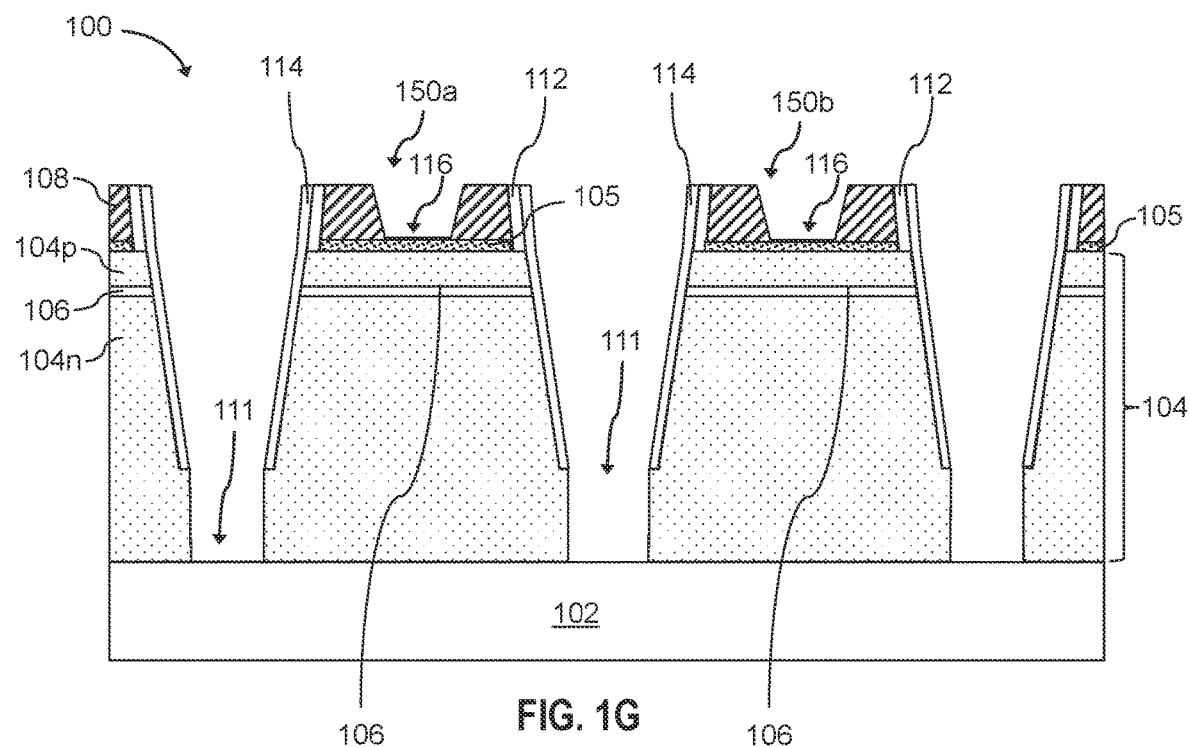
FIG. 1G illustrates a cross-sectional view of the stack after a step in the manufacture of a LED device according to one or more embodiments.
Figure 1H:
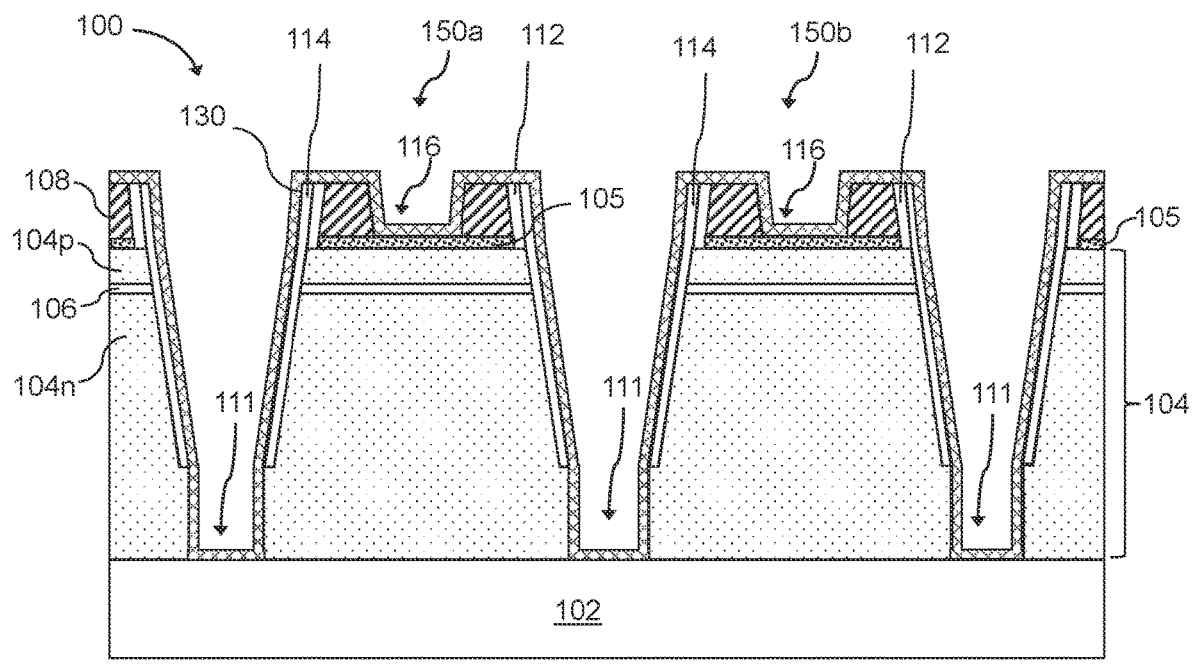
FIG. 1H illustrates a cross-sectional view of the stack after a step in the manufacture of a LED device according to one or more embodiments.
Figure 1I:
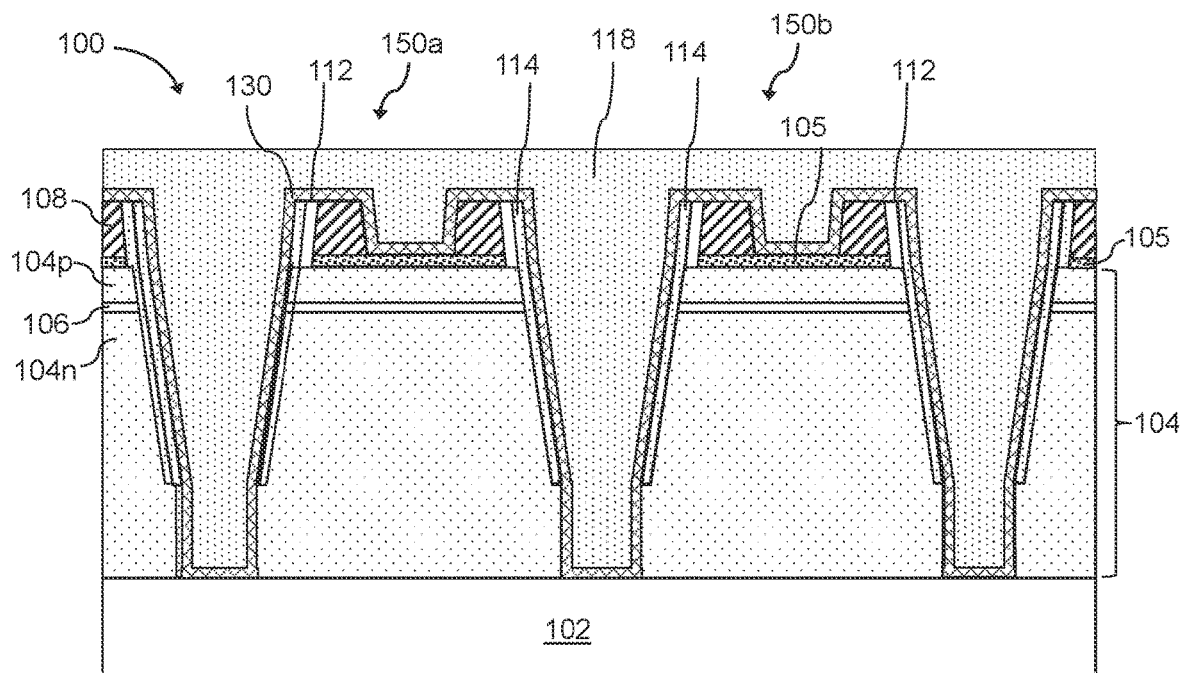
FIG. 1I illustrates a cross-sectional view of the stack after a step in the manufacture of a LED device according to one or more embodiments.
Figure 1J:
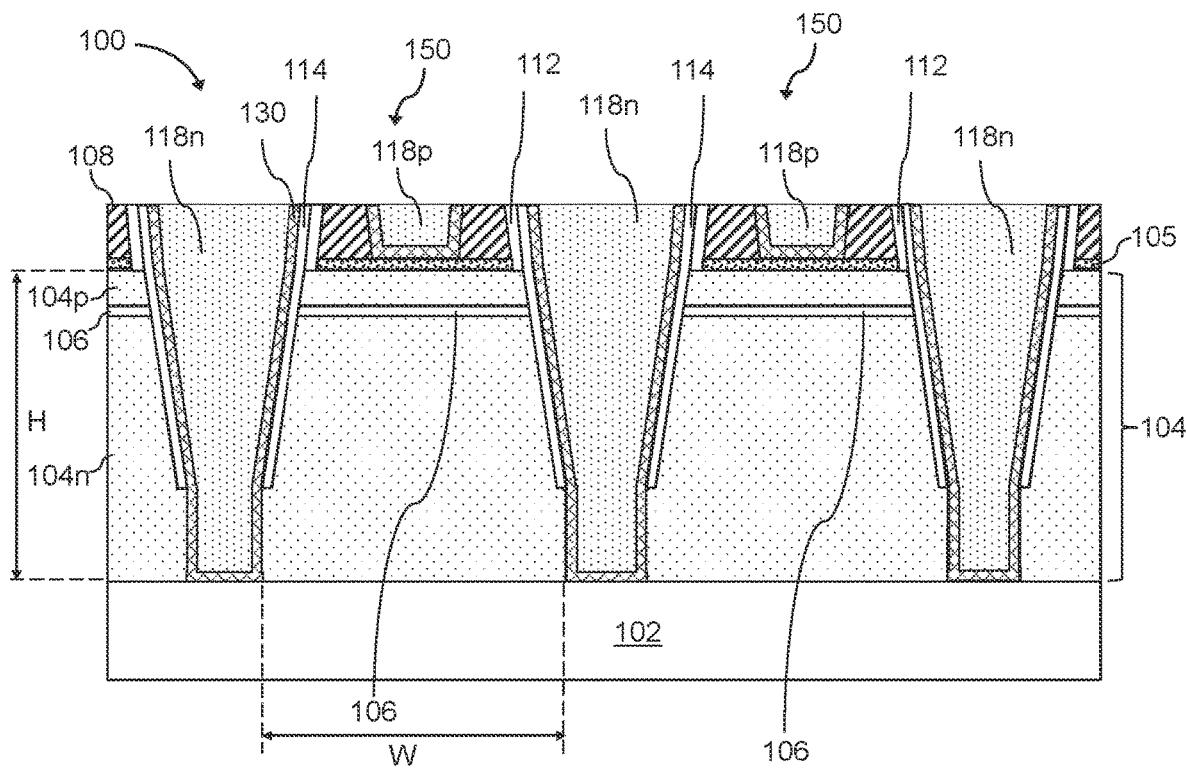
FIG. 1J illustrates a cross-sectional view of the stack after a step in the manufacture of a LED device according to one or more embodiments.
Figure 1K:
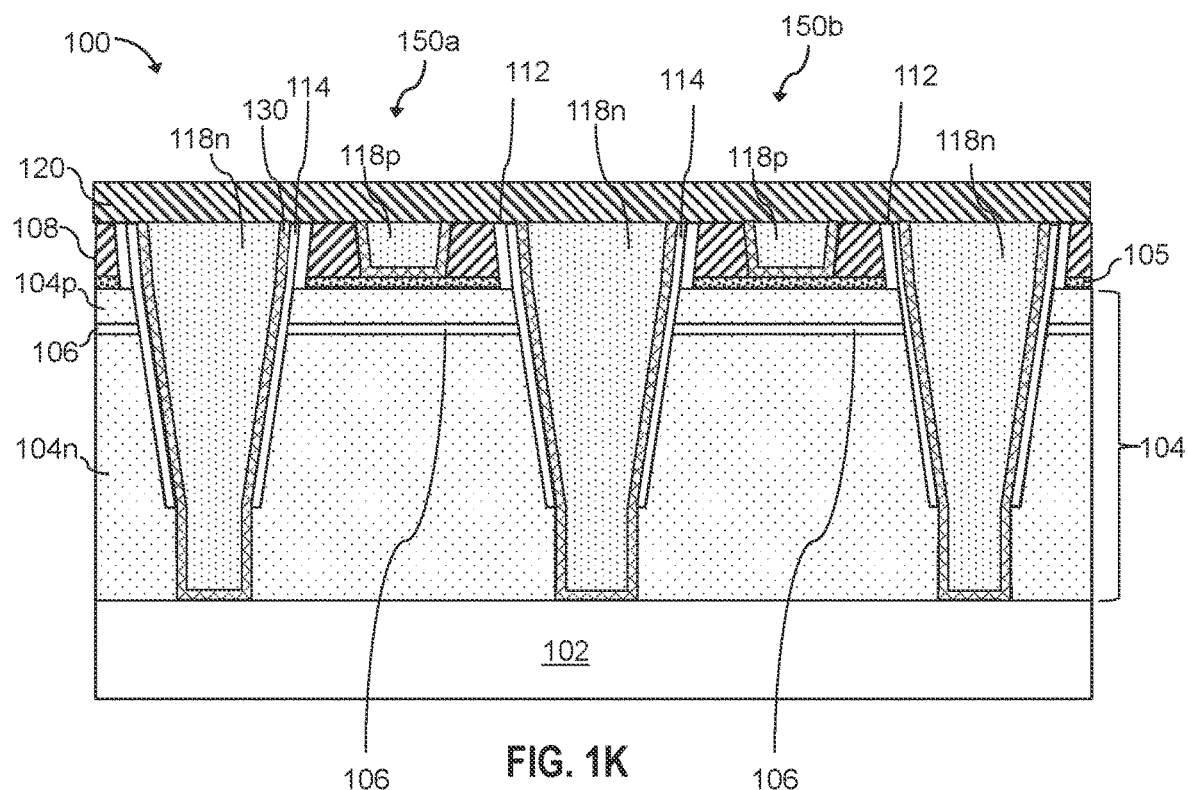
FIG. 1K illustrates a cross-sectional view of the stack after a step in the manufacture of a LED device according to one or more embodiments.
Figure 1L:
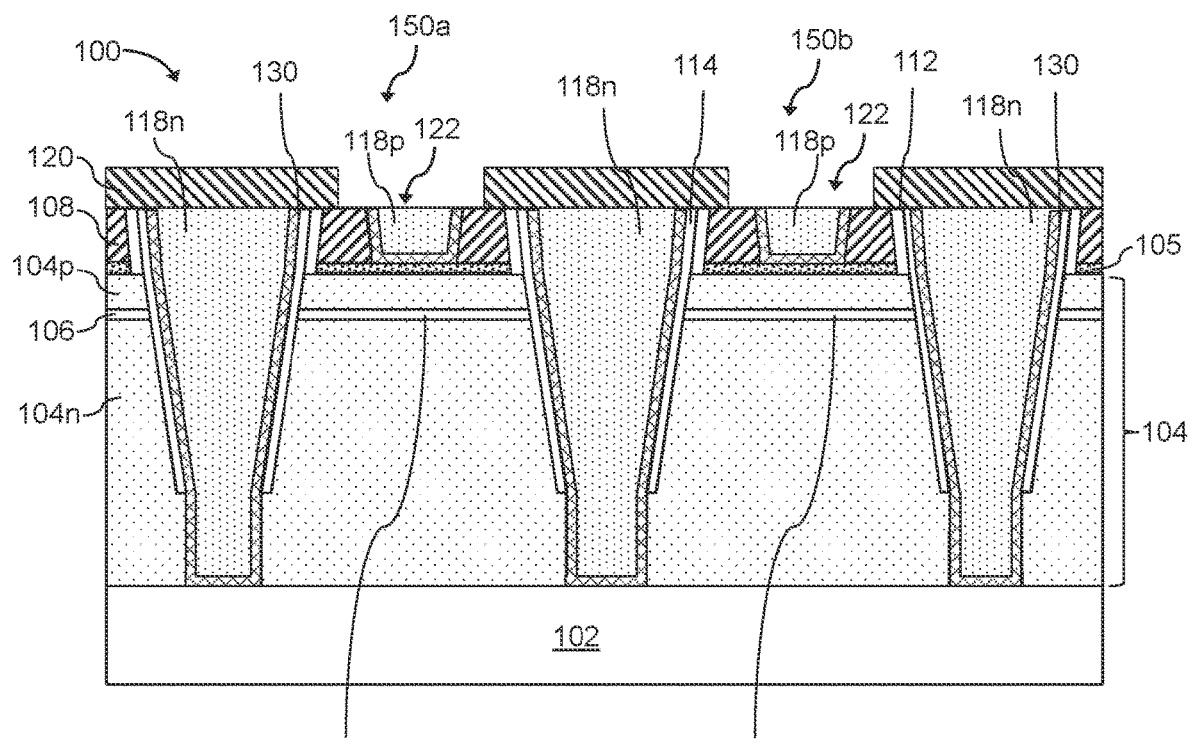
FIG. 1L illustrates a cross-sectional view of the stack after a step in the manufacture of a LED device according to one or more embodiments.
Figure 1M:
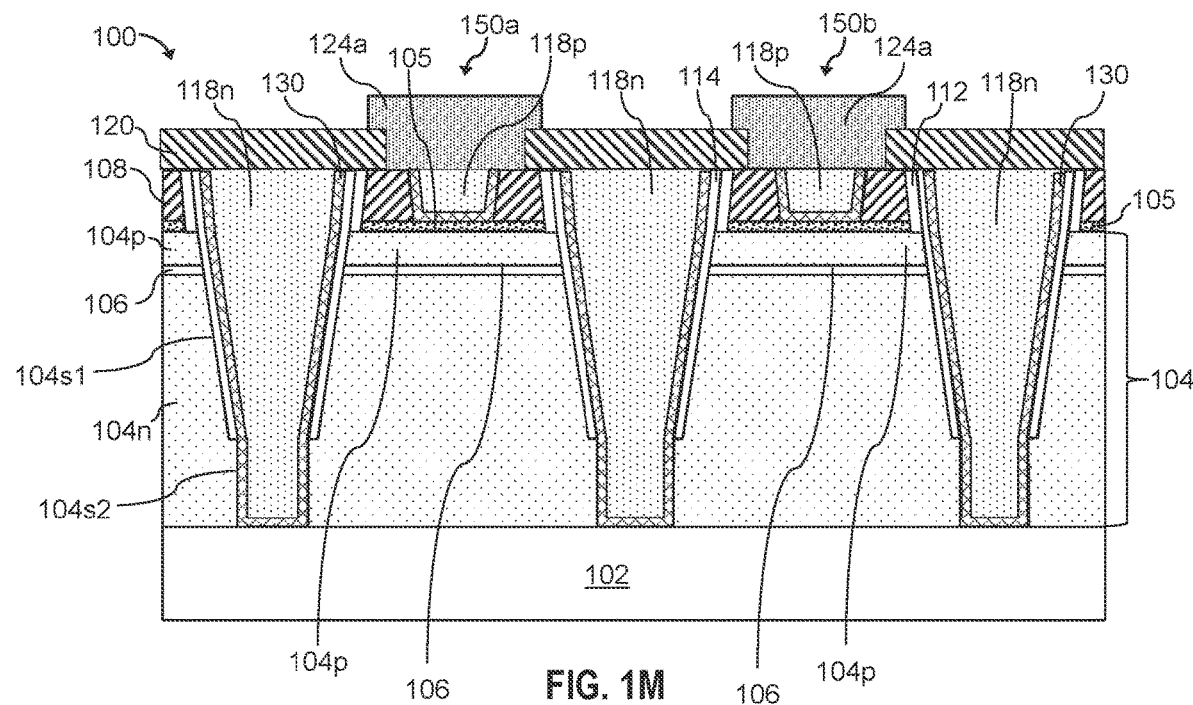
FIG. 1M illustrates a cross-sectional view of the stack after a step in the manufacture of a LED device according to one or more embodiments.
Figure 1N:
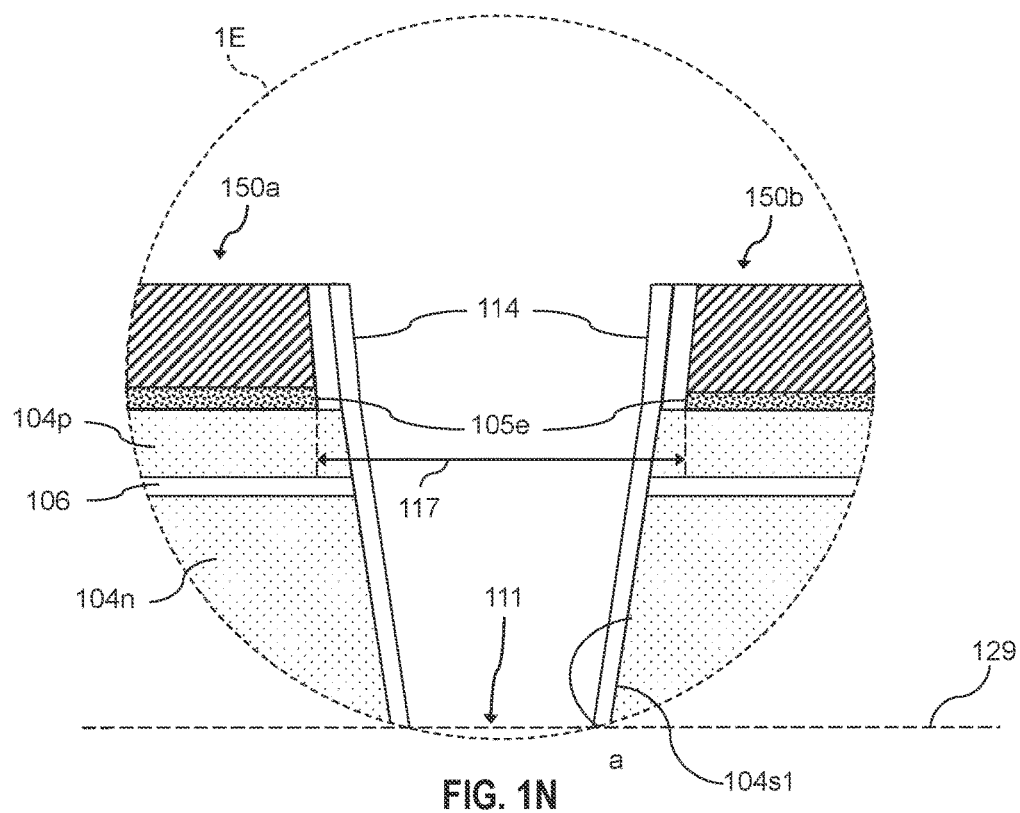
FIG. 1N is an enlarged view of a portion of the stack of FIG. 1E indicated by the dotted line circle 1N in FIG. 1E.
Figure 10:
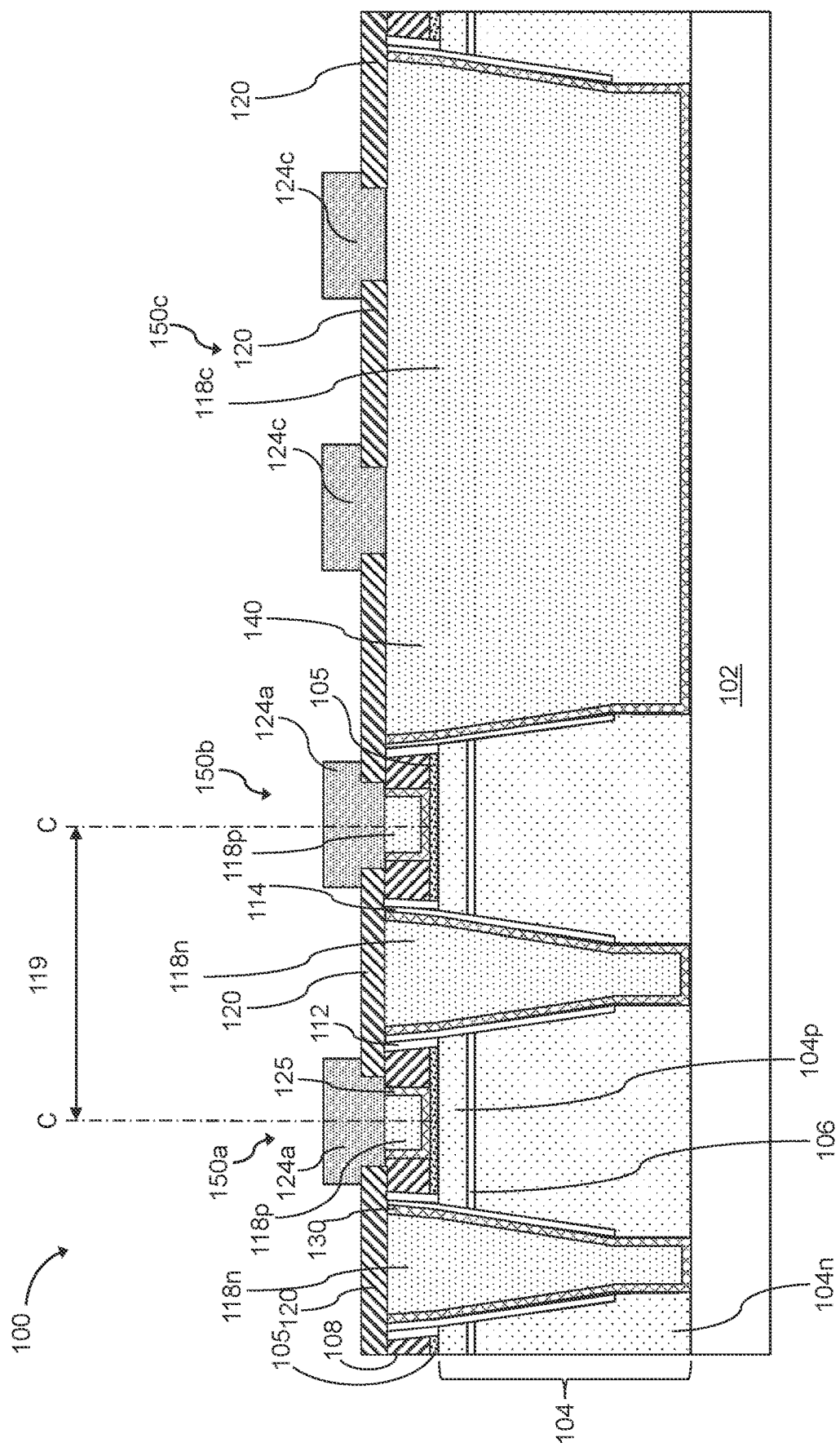

FIG. 1N is an enlarged view of a portion of the stack of FIG. 1E indicated by the dotted line circle 1N in FIG. 1E.

In one or more embodiments, a dark space or dark space gap 117 is formed between adjacent edges 105e of P-contact layers 105 on the first mesa 150a and the second mesa 150b as shown in FIG. 1B, FIG. 1E, and FIG. 1N. In one or more embodiments, the dark space gap 117 formed between the adjacent edges 105e of P-contact layers 105 on the first mesa 150a and the second mesa 150b is in a range from 10 μm to 0.5 μm, or in a range from 9 μm to 0.5 μm, or in a range of from 8 μm to 0.5 μm, or in a range of from 7 μm to 0.5 μm, or in a range of from 6 μm to 0.5 μm, or in a range of from 5 μm to 0.5 μm, or in a range of from 4 μm to 0.5 μm, or in a range of from 3 μm to 0.5 μm. In other embodiments, the dark space gap 117 formed between the adjacent edges 105e of P-contact layer 105 on the first mesa 150a and the second mesa 150b is in a range of from 10 μm to 4 μm, for example, in a range of from 8 μm to 4 μm. In embodiments of the LED device 100 each of the plurality of spaced mesas 150a, 150b comprise a P-contact layer 105 that is both conductive and reflective extending across a portion of each of the plurality of the mesas 150a, 150b and including an edge 105e, and the trench 111 between each of the plurality of spaced mesas results in a pixel pitch in a range of from 1 μm to 100 μm, including from 40 μm to 100 μm, 41 μm to 100 μm, and all values and subranges therebetween, and a dark space gap 117 between adjacent edges of the P-contact layer of less than 20% of the pixel pitch. In some embodiments, the pixel pitches is in a range of from 5 μm to 100 μm, 10 μm to 100 μm or 15 μm to 100 μm. In some embodiments, the dark space gap 117 between adjacent edges of the P-contact layer is greater than 1% of the pixel pitch, and less than 20%, 19%, 18%, 17%, 16%, 15%, 14%, 13%, 12%, 11%, 10%, 9%, 8%, 7%, 6% or 5% of the pixel pitch, when the pixel pitch is in a range of from 10 μm to 100 μm.

In one or more embodiments, each of the spaced mesas 150a, 150b includes sidewalls 104s, each having a first segment 104s1 and a second segment 104s2 (shown in FIG. 1M). The first segment 104s1 defines an angle "a" (as shown in FIG. 1N) in a range of from 60 degrees to 90 degrees from a horizontal plane 129 that is parallel with the N-type layer 104n and the P-type layer 104p. In some embodiments, the angle "a" is in a range of from 60 to 85 degrees, 60 to 80 degrees, 60 to 75 degrees, 60 to 70 degrees, 65 to 90 degrees 65 to 85 degrees, 65 to 80 degrees, 65 to 75 degrees, 65 to 70 degrees, 70 to 90 degrees, 70 to 85 degrees, 70 to 80 degrees, 70 to 75 degrees, 75 to 90 degrees, 75 to 85 degrees, 75 to 80 degrees, 80 to 90 degrees or 80 to 85 degrees. In one or more embodiments, the second segments 104s2 of the sidewalls form an angle with a top surface of a substrate upon which the mesas are formed in a range of from 75 to less than 90 degrees.

FIG. 1F is a cross-sectional view of the stack after a step in the manufacture of a LED device 100 according to one or more embodiments. With reference to FIG. 1F, the semiconductor layers 104 are etched and the trenches 111 are expanded (i.e. the depth of the trenches is increased) to expose a top surface 102t of the substrate 102. In one or more embodiments, the etching is selective such that the outer spacers 114 remain on the sidewalls of the trenches 111. In one or more embodiments, the trench 111 has a bottom 111b and sidewalls 113. In one or more embodiments, the trench 111 having a depth from a top surface 104t of the semiconductor layer forming the mesas in a range of from about 0.5 μm to about 2 μm.

FIG. 1G is a cross-sectional view of the stack after a step in the manufacture of a LED device 100 according to one or more embodiments. With reference to FIG. 1G, the first mesa 150a and second mesa 150b are patterned to form a via opening 116 on the top surface of the mesa, exposing a top surface of the semiconductor layers 104 and/or a top surface of the P-contact layer 105. In one or more embodiments, the first mesa 150a and second mesa 150b can be patterned according to any appropriate technique known one of skill in the art, such as a masking and etching process used in semiconductor processing.

FIG. 1H is a cross-sectional view of the stack after a step in the manufacture of a LED device 100 according to one or more embodiments. With reference to FIG. 1H, a reflective liner 130 is deposited on the substrate on: the sidewalls 113 and bottom 111b of the trenches 111, the sidewalls of the outer spacer 114, and along the hard mask layer 108 surface, and the top surface of the semiconductor layers 104 and/or the top surface of the P-contact layer 105. The reflective liner 130 may comprise any appropriate material known to one of skill in the art. In one or more embodiments, the reflective liner 130 comprises aluminum (Al).

In one or more embodiments, the reflective liner 130 is deposited by one or more of sputter deposition, atomic layer deposition (ALD), chemical vapor deposition (CVD), physical vapor deposition (PVD), plasma enhanced atomic layer deposition (PEALD), and plasma enhanced chemical vapor deposition (PECVD). In one or more embodiments, the deposition of the reflective liner 130 is selective deposition such that the reflective liner 130 is only deposited on the sidewalls 113 of the trench 111 and the sidewalls of the outer spacer 114.

FIG. 1I is a cross-sectional view of the stack after a step in the manufacture of a LED device according to one or more embodiments. With reference to FIG. 1I, an electrode metal 118, e.g., to yield an N-contact material 118n and/or a P-metal material plug 118p and/or a conducting metal 118c in a final product, is deposited on the substrate, including on top of the mesas 150a, 150b, in the via opening 116, and in the trenches 111. The electrode metal 118 can comprise any appropriate material known to the skilled artisan. In one or more embodiments, the electrode metal 118 comprises copper and the electrode metal material 118 is deposited by electrochemical deposition (ECD) of the copper.

FIG. 1J is a cross-sectional view of the stack after a step in the manufacture of a LED device 100 according to one or more embodiments. With reference to FIG. 1J, the electrode metal 118 is planarized, etched, or polished. Electrode metal 118 yields N-contact material 118n and a P-metal material plug 118p. As used herein, the term "planarized" refers to a process of smoothing surfaces and includes, but is not limited to, chemical mechanical polishing/planarization (CMP), etching, and the like.

FIG. 1K is a cross-sectional view of the stack after a step in the manufacture of a LED device 100 according to one or more embodiments. With reference to FIG. 1K, a passivation layer 120 is deposited on the substrate. In some embodiments, the passivation layer 120 is deposited directly on the planarized N-contact material 118n, the planarized P-metal material plug 118p, the top surface of the inner spacer 112, the top surface of the outer spacer 114, and the top surface of the hard mask layer 108. In other embodiments, there may be one or more additional layers between the passivation layer 120 and the planarized N-contact material 118n, the planarized P-metal material plug 118p, the top surface of the inner spacer 112, the top surface of the outer spacer 114, and the top surface of the hard mask layer 108. In some embodiments, the passivation material comprises the same material as the hard mask layer 108. In other embodiments, the passivation layer 120 comprises a material distinct from the hard mask layer 108.

In one or more embodiments, the passivation layer 120 may be deposited by any suitable technique known to one of skill in the art. In one or more embodiments, the passivation layer 120 is deposited by one or more of sputter deposition, atomic layer deposition (ALD), chemical vapor deposition (CVD), physical vapor deposition (PVD), plasma enhanced atomic layer deposition (PEALD), and plasma enhanced chemical vapor deposition (PECVD).

In one or more embodiments, the passivation layer 120 may be comprises by any suitable material known to one of skill in the art. In one or more embodiments, the passivation layer 120 comprises a dielectric material. Suitable dielectric materials include, but are not limited to, silicon oxide (SiO), silicon nitride (SiN), silicon carbide (SiC), aluminum oxide ($AlO_x$), aluminum nitride (AlN) and combinations thereof.

FIG. 1L is a cross-sectional view of the stack after a step in the manufacture of a LED device 100 according to one or more embodiments. With reference to FIG. 1L, the passivation layer 120 is patterned to form at least one opening 122, exposing a top surface of the P-metal material plug 118p. Two openings 122 are shown. The passivation layer 120 may be patterned using any suitable technique known to one of skill in the art including, but not limited to, lithography, wet etching, or dry etching.

FIG. 1M is a cross-sectional view of the stack after a step in the manufacture of a LED device 100 according to one or more embodiments. With reference to FIG. 1M, under bump metallization (UBM) material forms an under bump metallization (UBM) layer 124a, which is deposited in the openings 122. As used herein, "under bump metallization (UBM)" refers to the metal layer which is required for connecting a die to a substrate with solder bumps for flip-chip packages. In one or more embodiments, the UBM layer 124a may be a patterned, thin-film stack of material that provides an electrical connection from the die to a solder bump, provides a barrier function to limit unwanted diffusion from the bump to the die, and provides a mechanical interconnection of the solder bump to the die through adhesion to the die passivation and attachment to a solder bump pad. The UBM layer 124a may comprise any suitable metal known to the skilled artisan. In one or more embodiments, the UBM layer 124a may comprise gold (Au).

In one or more embodiments, under bump metallization (UBM) may be achieved by any technique known to one of skill in the art including, but not limited to, a dry vacuum sputter method combined with electroplating. In one or more embodiments, a dry vacuum sputter method combined with electroplating consists of multi-metal layers being sputtered in a high temperature evaporation system.

In FIG. 1M, the UBM layer 124a is patterned (e.g. by masking and etching). The UBM layer 124a may be patterned using any suitable technique known to one of skill in the art including, but not limited to, lithography, wet etching, or dry etching. The patterning of the UBM layer 124a provides anode pads in contact with the P-metal material plug 118p over the P-contact layer 105 at the first mesa 150a and the second mesa 150b.

FIG. 1O is a cross-sectional view of a finished LED device according to one or more embodiments. With reference to FIG. 1O, the finished LED device 100 comprises the features shown in FIG. 1M, and further includes a common electrode (common cathode) 140 formed at an end of the device 100 as viewed in cross-section. UBM material has been patterned to provide anode pads 124a in contact with the P-metal material plug 118p over the P-contact layer 105 at the first mesa 150a and the second mesa 150b. Common cathode 140 comprises a conducting metal 118c. Under bump metallization (UBM) material also provides cathode pads 124c in contact with the common cathode 140, patterned analogously to the UBM layers 124a. In one or more embodiments, the plurality of spaced mesas 150a, 150b defines a matrix of pixels, and the matrix of pixels are surrounded by the common electrode 140.

In one or more embodiments, the common electrode 140 is a pixelated common cathode comprising a plurality of semiconductor stacks surrounded by a conducting metal. In one or more embodiments, the semiconductor stacks comprise semiconductor layers 104, which according to one or more embodiments comprise epitaxial layers, III-nitride layers or epitaxial III-nitride layers. In a specific embodiment, one or more semiconductor layers comprise GaN.

Figure 5B:
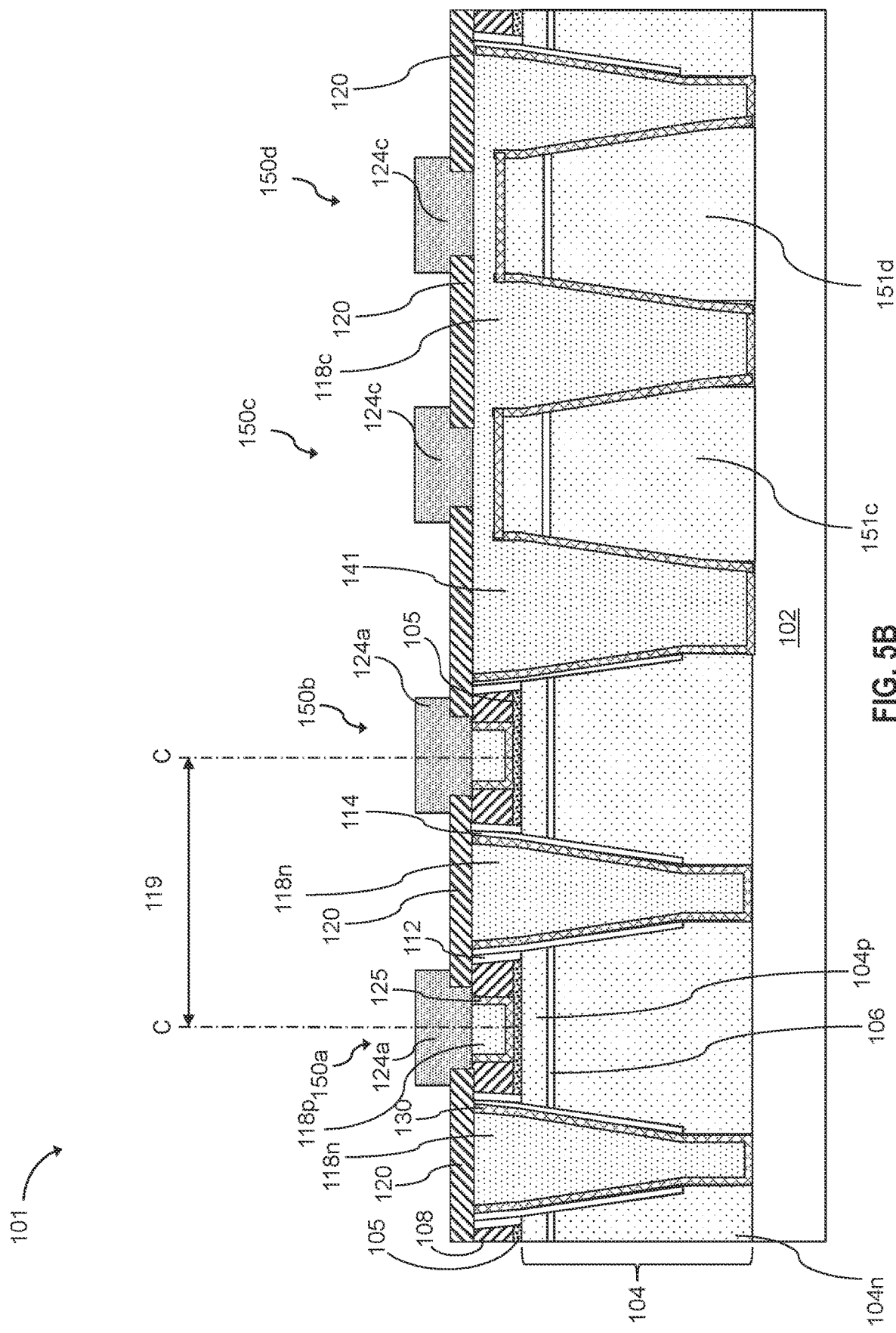
FIG. 5B illustrates a variation of FIG. 1O based on further processing of a stack according to FIG. 5A.

To fabricate a pixelated common electrode, processing proceeds in accordance with FIGS. 1A to 1F, at which point rather than preparing via openings 116 as shown in FIG. 1G, a portion of the mesas are etched to expose the top surface of the semiconductor layers. Turning to FIG. 5A, third mesa 150c and fourth mesa 150d are etched to expose the top surface 104t of the semiconductor layers 104, thereby forming semiconductor stacks 151c and 151d, respectively. That is, the inner spacers 112, the hard mask layer 108, and the P-contact layer 105 on the third mesa 150c and the fourth mesa 150d are removed. Sidewalls of the third mesa 150c and the fourth mesa 150d are exposed upon etching of the outer spacers 114. Thereafter, processing of the third mesa 150c and the fourth mesa 150d proceeds in accordance with: FIG. 1H to add the reflective liner layer 130, FIG. 1I to deposit the electrode materials 118, and FIGS. 1J-1M, to form a pixelated common cathode as shown in FIG. 5B.

In the embodiment of FIG. 5B, a finished LED device 101 comprises the features shown in FIG. 5A, thereafter processed according to FIGS. 1H-1M, and FIG. 1M, including a common electrode (common cathode) 141 formed at an end of the device 101 as viewed in cross-section. UBM material has been patterned to provide anode pads 124a in contact with the P-metal material plug 118p over the P-contact layer 105 at the first mesa 150a and the second mesa 150b. The third mesa 150c and fourth mesa 150d defines or forms semiconductor stacks 151c and 151d, respectively, surrounded by conducting metal 118c. The semiconductor stacks 151c and 151d are inactive in that they do not generate light. Under bump metallization (UBM) material also provides cathode pads 124c in contact with the common cathode 141, patterned analogously to the UBM layers 124a.

Figure 2:
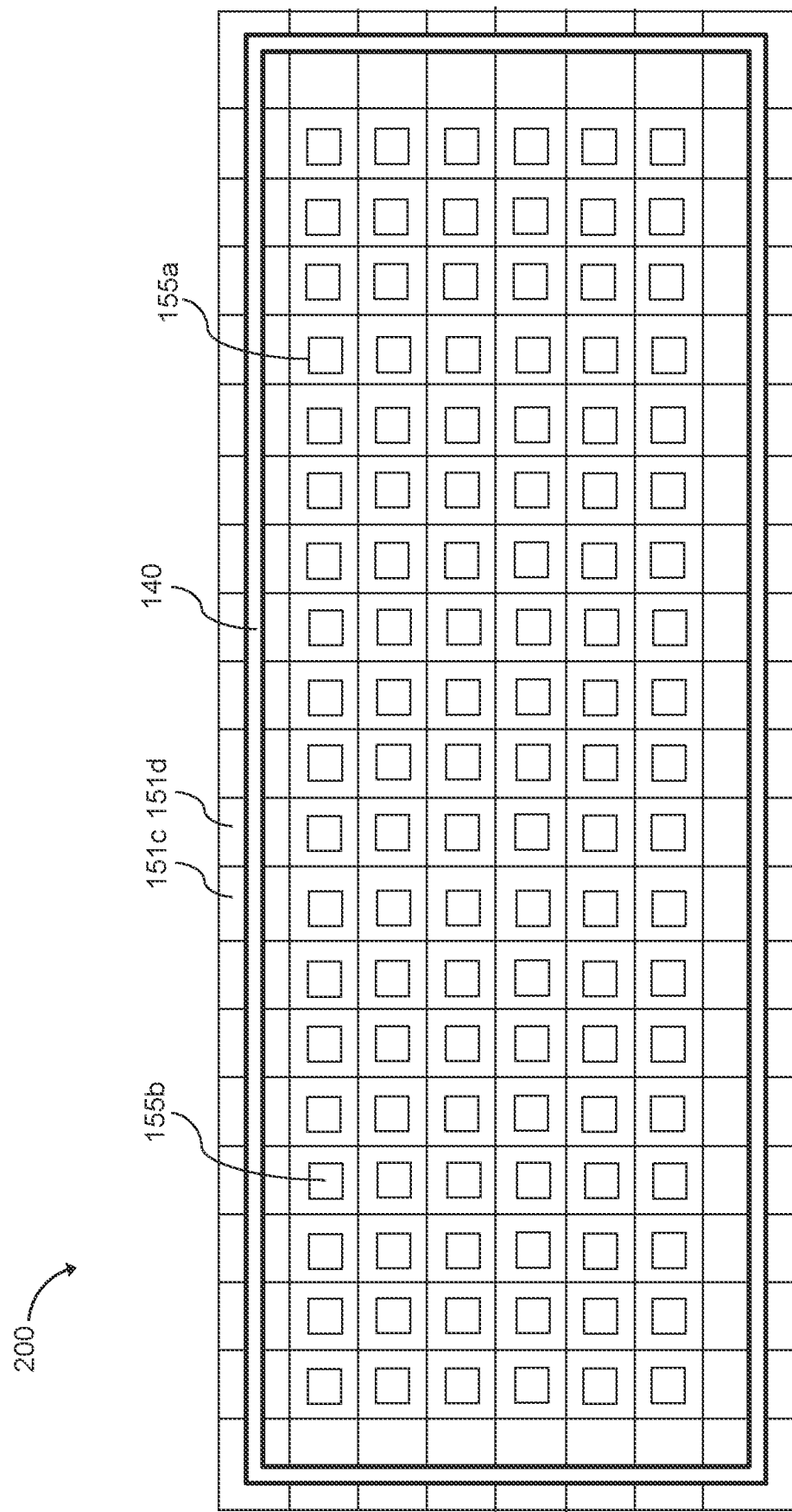
FIG. 2 illustrates a top view of an LED array according to one or more embodiments.

FIG. 2 shows a top plan view of an LED monolithic array 200 comprising a plurality of pixels 155 (of which 155a and 155b are examples) which are defined or formed by a plurality of spaced mesas as described herein with respect to FIGS. 1A-1O. For example, the first mesa 150a defines or forms a first pixel 155a and the second mesa 150b defines or forms a second pixel 155b. The third mesa 150c and fourth mesa 150d forms or provides a inactive pixels, or semiconductor stacks 151c and 151d. The pixels 155 are arranged in grid and connected by a common cathode 140. In one or more embodiments, an array of spaced mesas comprises an arrangement of mesas in two directions. For example, the array can comprise an arrangement of 2×2 mesas, 4×4 mesas, 20×20 mesas, 50×50 mesas, 100×100 mesas, or n1×n2 mesas, where each of n1 and n2 is a number in a range of from 2 to 1000, and n1 and n2 can be equal or not equal.

One or more embodiments provide light emitting diode (LED) device 100 comprising a plurality of spaced mesas 150a, 150b defining pixels 155a, 155b, each of the plurality of spaced mesas 150a, 150b comprising semiconductor layers 104, the semiconductor layers including an N-type layer 104n, an active region 106, and a P-type layer 104p, each of the spaced mesas 150a, 150b having a height H and a width W, where the height H is less than or equal to the width W. The LED device 100 further comprises a metal 118 in a trench 111 in the form of a trench 111 between each of the plurality of spaced mesas 150a, 150b, the metal 118 providing optical isolation between each of the spaced mesas 150a, 150b, and electrically contacting the N-type layer 104n of each of the spaced mesas 150a, 150b along sidewalls of the N-type layers 104n. In one or more embodiments, the LED device 100 comprises a first dielectric material 114 which insulates sidewalls of the P-type layer 104p (sidewall 104s) and the active region 106 (sidewall 106s) from the N-contact material 118n. A P-metal material plug 118p is in electrical communication with the p-contact layer 105. In embodiments of the LED device 100 each of the plurality of spaced mesas 150a, 150b comprise a conductive p-contact layer 105 extending across a portion of each of the plurality of the mesas 150a, 150b and including an edge 105e, and the trench 111 between each of the plurality of spaced mesas results in a pixel pitch in a range of from 1 μm to 100 μm, including 51 μm to 100 μm, and all values and subranges therebetween, and a dark space gap 117 between adjacent edges of the p-contact layer of less than 20% of the pixel pitch. In some embodiments, the pixel pitches is in a range of from 5 μm to 100 μm, 10 μm to 100 μm or 15 μm to 100 μm. In other embodiments, the dark space gap 117 is in a range of from 10 μm to 0.5 μm, in a range of from 10 μm to 4 μm, for example, in a range of from 8 μm to 4 μm. As used herein according to one or more embodiments and as shown in FIG. 1O, "pixel pitch" means a distance or spacing 119 between a center "C" of adjacent pixels provided or formed by mesas 150a, 150b. In other words, pixel pitch refers to a center-to-center spacing 119 of adjacent pixels. In one or more embodiments, the center-to-center spacing for an array of LEDs as shown in FIG. 2 is the same for adjacent pixels 155a, 155b and all adjacent pixels of the array 200. In one or more embodiments, the pixel pitch is in a range of from 5 μm to 100 μm, for example in a range of from 5 μm to 90 μm, 5 μm to 80 μm, 5 μm to 70 μm, 5 μm to 60 μm, 5 μm to 50 μm, 5 μm to 40 μm, 5 μm to 30 μm, 10 μm to 90 μm, 10 μm to 80 μm, 10 μm to 70 μm, 10 μm to 60 μm, 10 μm to 50 μm, 10 μm to 40 μm, 10 μm to 30 μm, 20 μm to 90 μm, 20 μm to 80 μm, 20 μm to 70 μm, 20 μm to 60 μm, 20 μm to 50 μm, 20 μm to 40 μm, 20 μm to 30 μm, 30 μm to 90 μm, 30 μm to 80 μm, 30 μm to 70 μm, 30 μm to 60 μm, 30 μm to 50 μm, 30 μm to 40 μm, 40 μm to 90 μm, 40 μm to 80 μm, 40 μm to 70 μm, 40 μm to 60 μm, 40 μm to 50 μm, 50 μm to 90 μm, 50 μm to 80 μm, 50 μm to 70 μm, or 50 μm to 60 μm.

In one or more embodiments, a light emitting diode (LED) device comprises: a plurality of mesas defining pixels, each of the plurality of mesas comprising semiconductor layers, the semiconductor layers including an N-type layer, an active layer, and a P-type layer, each of the mesas having a height less than or equal to their width; an N-contact material in a space between each of the plurality of mesas, the N-contact material providing optical isolation between each of the mesas, and electrically contacting the N-type layer of each of the mesas along sidewalls of the N-type layers; a dielectric material which insulates sidewalls of the P-type layer and the active region from the N-contact material; and each of the plurality of mesas comprising a p-contact layer extending across a portion of each of the plurality of mesas and including an edge, and the space between each of the plurality of mesas results in a pixel pitch in a range of from 10 μm to 100 μm and a dark space gap between adjacent edges of the p-contact layer of less than 20% of the pixel pitch. In one or more embodiments, the p-contact layer comprises a reflective metal. The LED device of claim 1, wherein the pixel pitch is in a range of from 40 μm to 100 μm. In one or more embodiments, the dark space gap between adjacent edges of the p-contact layer of less than 10% of the pixel pitch. The LED device of claim 1, wherein the semiconductor layers are epitaxial semiconductor layers having a thickness in a range of from 2 μm to 10 μm. In one or more embodiments, the dielectric material is in a form of outer spacers comprising a material selected from the group consisting of $SiO_2$, $AlO_x$, and SiN, having a thickness in a range of from 200 nm to 1 μm. In one or more embodiments, the N-contact material has a depth from a top surface of the mesa in a range of from 0.5 μm to 2 μm. In one or more embodiments, each of the mesas includes sidewalls, each having a first segment and a second segment, wherein the first segments of the sidewalls define an angle in a range of from 60 degrees to 90 degrees from a horizontal plane that is parallel with the N-type layer and the P-type layer, the second segments of the sidewalls form an angle with a top surface of a substrate upon which the mesas are formed in a range of from 75 to less than 90 degrees.

In one or more embodiments, a light emitting diode (LED) device comprises: a plurality of mesas defining pixels, each of the plurality of mesas comprising semiconductor layers, the semiconductor layers including an N-type layer, an active layer, and a P-type layer, each of the mesas having a height less than or equal to their width; a metal in a space between each of the plurality of mesas, the metal providing optical isolation between each of the mesas, and electrically contacting the N-type layer of each of the mesas along sidewalls of the N-type layers; a dielectric material which insulates sidewalls of the P-type layer and the active layer from the metal; and each of the plurality of mesas comprising a p-contact layer extending across a portion of each of the plurality of mesas and including an edge, and the space between each of the plurality of mesas results in a pixel pitch in a range of from 10 μm to 100 μm and a dark space gap between adjacent edges of the p-contact layer in a range of from 4 μm to 10 μm. the plurality of mesas comprises an array of mesas. In one or more embodiments, the dark space gap is in a range of from 4 μm and to 8 μm. In one or more embodiments, the pixel pitch is in a range of from 40 μm to 100 μm.

Figure 3A:
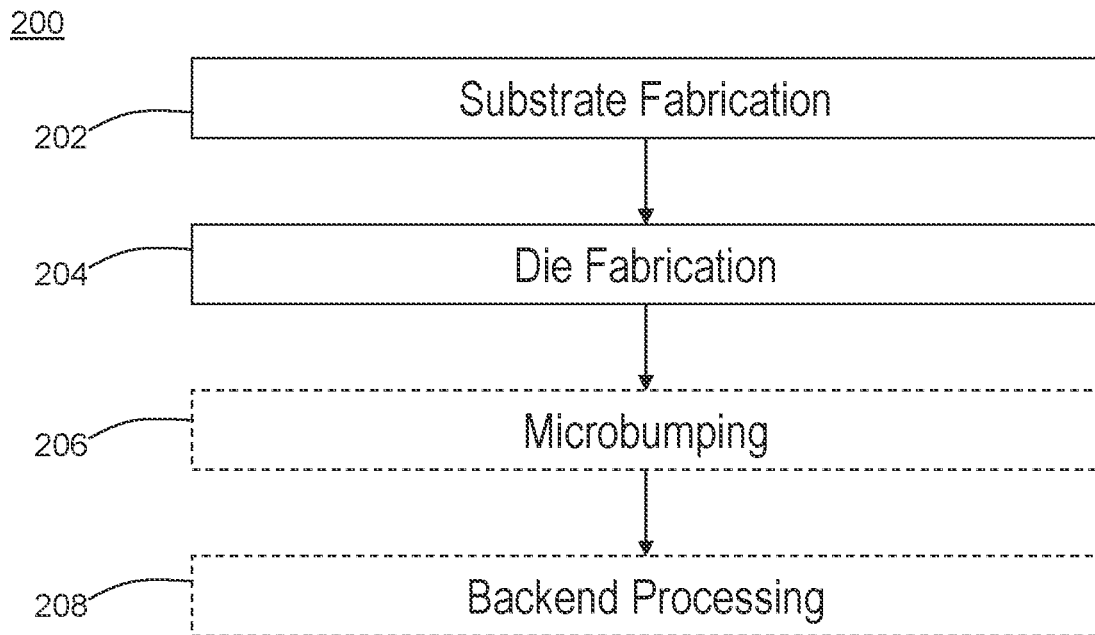
FIG. 3A illustrates a process flow diagram for a method of manufacture according to one or more embodiments.

One or more embodiments of the disclosure provide a method of manufacturing an LED device. FIGS. 3A-3F illustrate process flow diagrams according to various embodiments. With reference to FIG. 3A, the method 200 comprises at operation 202 fabrication of a substrate. Substrate fabrication can include depositing a plurality of semiconductor layers including, but not limited to an N-type layer, an active region, and a P-type layer on a substrate. Once the semiconductor layers are deposited on the substrate, a portion of the semiconductor layers are etched to form trenches and a plurality of spaces mesas. At operation 204, a die is fabricated. Die fabrication includes depositing a (first) dielectric material to insulate sidewalls of the epitaxial layers (e.g., N-type layer, active region, and P-type layer), which is followed by deposition of an electrode metal in the trenches, e.g., spaces between each of the plurality of spaced mesas. In some embodiments, the die fabrication further includes depositing a P-contact layer and a hard mask, forming a current spreading film, plating a p-metal material plug, followed by under bump metallization (UBM). At operation 204, a die is fabricated. At operation 206, optional microbumping may occur on a complementary metal oxide semiconductor (CMOS) backplane. At operation 208, optionally, backend processing occurs such that the die is connected to the CMOS backplane, underfill is provided, laser lift off occurs, followed by optional phosphor integration.

Figure 3B:
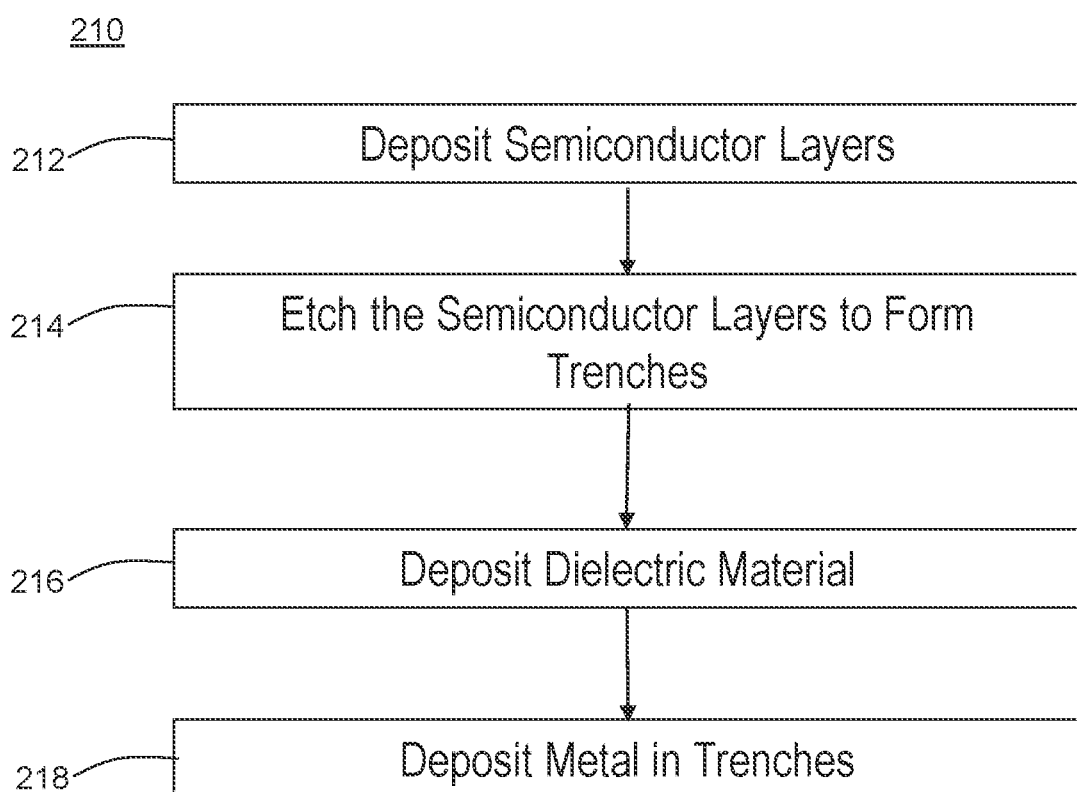
FIG. 3B illustrates a process flow diagram for a method of manufacture according to one or more embodiments.

With reference to FIG. 3B, in one embodiment, the method 210 comprises at 212 depositing a plurality of semiconductor layers including an N-type layer, an active region, and a P-type layer on a substrate. At 214, the method further comprises etching a portion of the semiconductor layers to form trenches and a plurality of spaced mesas defining pixels, each of the plurality of spaced mesas comprising the semiconductor layers and each of the spaced mesas having a height less than or equal to their width. At 216, the method comprises depositing a dielectric material which insulates sidewalls of the P-type layer and the active region from the metal. At 218, the method comprises depositing an electrode metal in a space between each of the plurality of spaced mesas, the metal providing optical isolation between each of the spaced mesas, and electrically contacting the N-type layer of each of the spaced mesas along sidewalls of the N-type layers. In one or more embodiments, each of the plurality of spaced mesas comprising a conductive p-contact layer extending across a portion of each of the plurality of mesas and including an edge, and the space between each of the plurality of spaced mesas results in a pixel pitch in a range of from 1 μm to 100 μm and dark space gap between adjacent edges of the p-contact layer of less than 20% of the pixel pitch. In some embodiments, the pixel pitches is in a range of from 5 μm to 100 μm, 10 μm to 100 μm or 15 μm to 100 μm. In other embodiments, the dark space gap is in a range of from 10 μm to 0.5 μm, or in a range of from 10 μm to 4 μm, for example, in a range of 8 μm to 4 μm. As used herein, according to one or more embodiments, the term "dark space gap" refers to the space between adjacent edges of the p-contact layer where no light is reflected.

In some embodiments, the method comprises forming an array of spaced mesas. In some embodiments, the metal comprises a reflective metal. In some embodiments, the dark space gap is in a range of from to 10 μm to 0.5 μm or in a range of from 10 μm to 4 μm. In some embodiments, the plurality of spaced mesas is arranged into pixels, and the pixel pitch in a range of from 5 μm to 100 μm or from 30 μm to 50 μm. In some embodiments, the semiconductor layers 104 have a thickness in a range of from 2 μm to 10 μm.

Figure 3C:
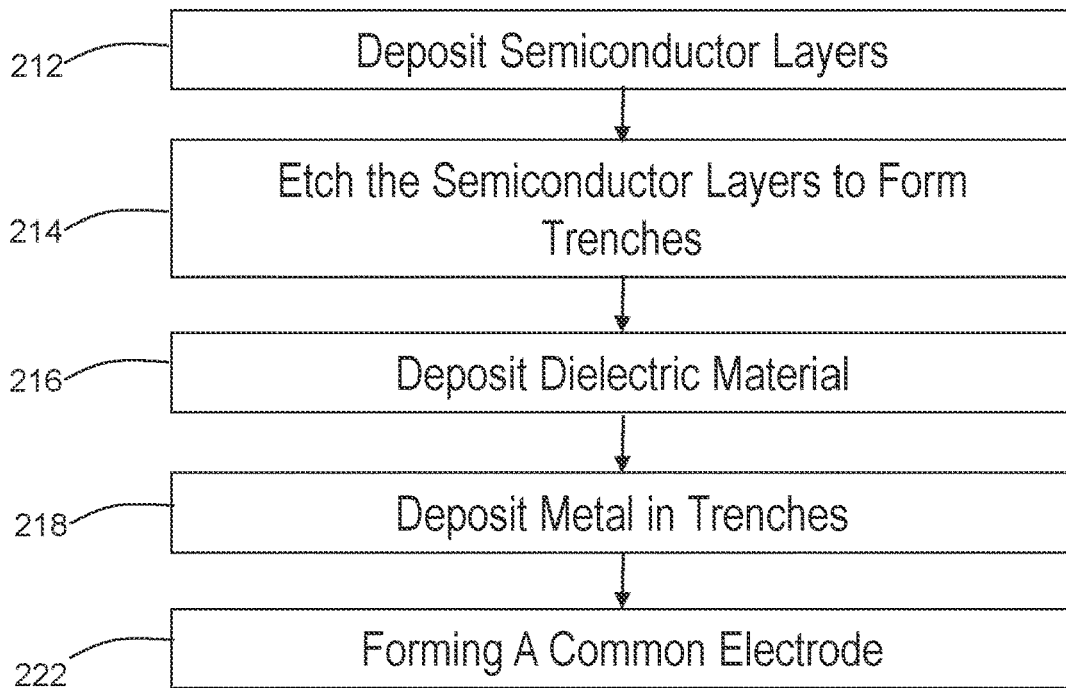
FIG. 3C illustrates a process flow diagram for a method of manufacture according to one or more embodiments.

With reference to FIG. 3C, further to operations 212 to 218 of FIG. 3B, a method 220 comprises at operation 222 forming a common electrode. In one or more embodiments, the common electrode comprises a plurality of semiconductor stacks surrounded by a conducting metal. In one or more embodiments, the semiconductor stacks comprise one or more layers of GaN.

Figure 3D:
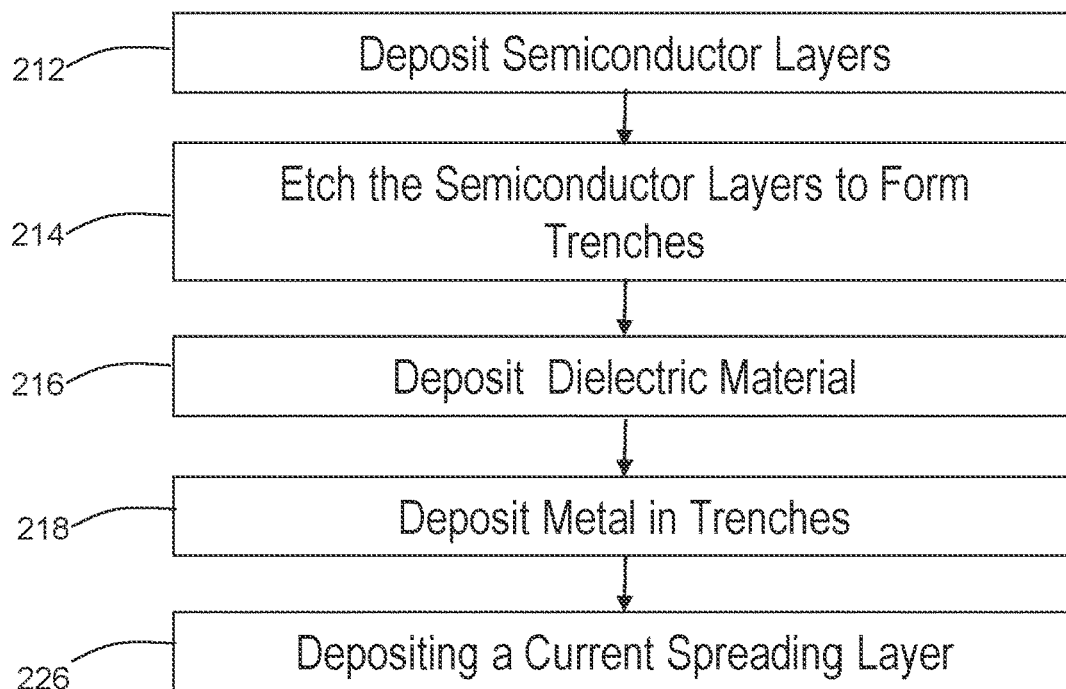
FIG. 3D illustrates a process flow diagram for a method of manufacture according to one or more embodiments.

With reference to FIG. 3D, further to operations 212 to 218 of FIG. 3B, a method 224 comprises at operation 226 deposition of a current spreading layer. Some method embodiments comprise forming a multilayer composite film on the P-type layer, the multilayer composite film comprising the current spreading layer, a P-contact layer on a first portion of the current spreading layer, and a (second) dielectric layer on a second portion of the current spreading layer below a hard mask layer. In one or more embodiments, the multilayer composite film comprises a current spreading layer on the P-type layer, the current spreading layer having a first portion and a section portion; a dielectric layer on the second portion of the current spreading layer; a via opening defined by sidewalls in the dielectric layer and the first portion of the current spreading layer; and a P-contact layer in the via opening on: the first portion of the current spreading layer, the sidewalls of the dielectric layer, and at least a portion of a surface of the dielectric layer. In one or more embodiments, the multilayer composite film is formed directly on the P-type layer. In other embodiments, there may be one or more additional layers formed between the multilayer composite film and the P-type layer. In one or more embodiments, the multilayer composite layer includes a guard layer on the P-contact layer.

Some method embodiments comprising depositing a current spreading layer over the P-type layer. Other method embodiments comprise depositing a current spreading layer over the P-type layer; depositing a dielectric layer on the current spreading layer; forming a via opening in the dielectric layer; conformally depositing a P-contact layer in the via opening and on a top surface of the dielectric layer; depositing a guard layer on the P-contact layer; depositing a hard mask layer on the guard layer; forming an opening in the hard mask layer; depositing a liner layer in the opening in the hard mask layer; and depositing a P-metal material plug on the liner layer, the P-metal material plug having a width; and forming a passivation layer on the P-metal material plug, the passivation layer having an opening therein defining a width, the width of the opening in the passivation layer is less than the width of a combination of the P-metal material plug and the liner layer in the opening.

Figure 3E:
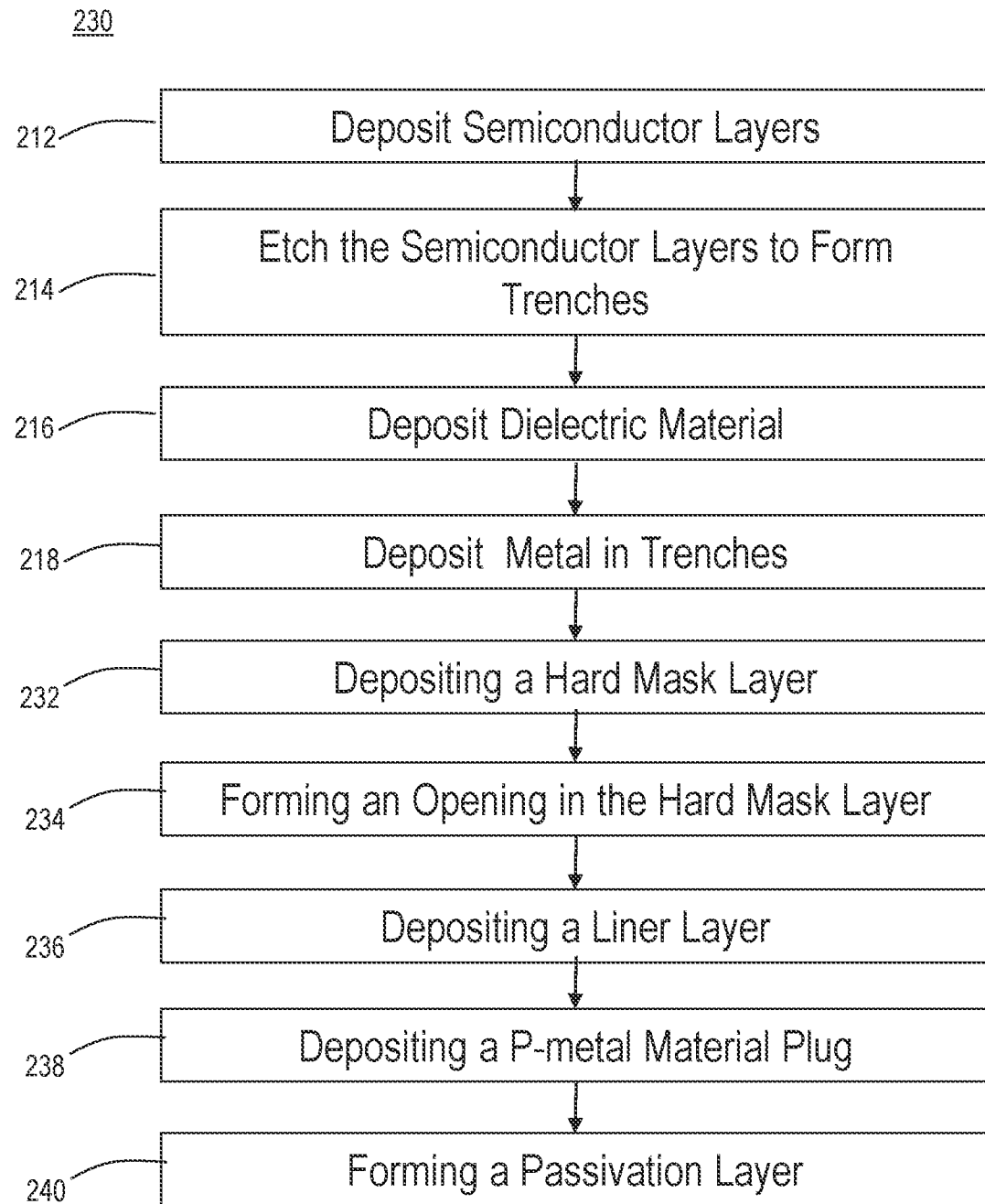
FIG. 3E illustrates a process flow diagram for a method of manufacture according to one or more embodiments.
Figure 3F:
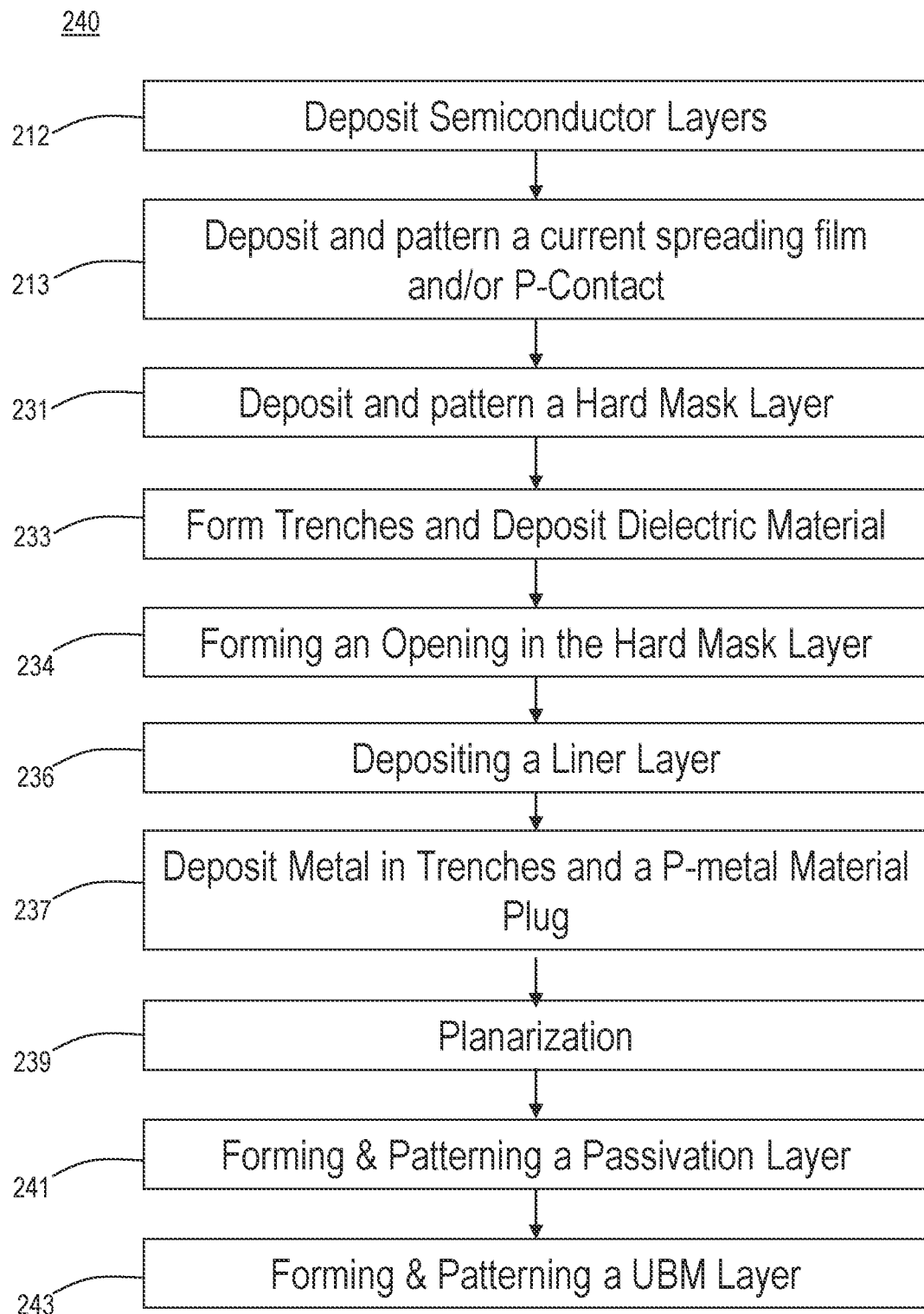
FIG. 3F illustrates a process flow diagram for a method of manufacture according to one or more embodiments.

With reference to FIG. 3E, some method embodiments comprise a method 230 including at operation 232, depositing a hard mask layer above or over the P-type layer. At operation 234, an opening is formed in the hard mask layer. At operation 236, in one or more embodiments, a liner layer is deposited in the opening in the hard mask layer. At operation 238, in one or more embodiments, a P-metal material plug is deposited on the liner layer, the P-metal material plug having a width, and, at operation 240, a passivation layer is formed on the P-metal material plug, the passivation layer having an opening therein defining a width, the width of the opening in the passivation layer less than the width of the P-metal material plug.

In one or more embodiments, a method of manufacturing a light emitting diode (LED) device comprising: depositing a plurality of semiconductor layers including an N-type layer, an active region, and a P-type layer on a substrate; depositing a hard mask layer over the P-type layer; etching a portion of the semiconductor layers and the hard mask layer to form trenches and plurality of mesas defining pixels, each of the plurality of mesas comprising the semiconductor layers and each of the mesas having a height less than or equal to their width; depositing a dielectric material in the trenches; forming an opening in the hard mask layer, and etching the semiconductor layers to expose a surface of the substrate and a sidewall of the N-type layer; depositing a liner layer on the substrate, including on surfaces of the opening in the hard mask layer, the dielectric material, the N-type layer, and substrate; depositing an electrode metal on the liner layer; planarizing the substrate to form an N-contact material electrically contacting the N-type layer of each of the mesas along sidewalls of the N-type layers, and a P-metal material plug on the liner layer in the opening of the hard mask layer, a combination of the P-metal material plug and the liner layer in the opening of the hard mask layer having a width; and forming a passivation layer on the substrate and forming openings in the passivation layer defining a width. In one or more embodiments, the width of each opening in the passivation layer is less than the width of the combination of the P-metal material plug and the liner layer.

With reference to 3F, some method embodiments comprise a method 240, which includes at operation 212, depositing semiconductor layers, for example, as described with respect to FIG. 1A. Method 240 further comprises at operation 213 deposing a current spreading film or layer and/or a P-contact layer, for example, as described with respect to FIG. 1A. Method 240 further includes at operation 231, depositing and patterning a hard mask layer, for example, as described with respect to FIGS. 1A-C. At operation 233, trenches are formed in the semiconductor layers and dielectric material is deposited, for example, as described with respect to FIGS. 1D-G. At operation 234, an opening is formed in the hard mask layer, for example, as described with respect to FIG. 1H. At operation 236, in one or more embodiments, a liner layer is deposited in the opening in the hard mask layer, for example, as described with respect to FIG. 1H. At operation 237, metal is deposited in the trenches and a P-metal material plug is deposited, for example, as described with respect to FIG. 1I. At operation 239, planarization is performed, for example, as described with respect to FIG. 1J. At operation 241, a passivation layer is formed and patterned, for example, as described with respect to FIGS. 1K and 1L. At operation 243, the under bump metallization layer is formed and patterned, for example, as described with respect to FIG. 1M. The operations of method 240 can be utilized according to one or more embodiments to form the device as shown in FIG. 1O or FIG. 4.

Another aspect of the disclosure pertains to an electronics system. In one or more embodiments, an electronic system comprises the LED monolithic devices and arrays described herein and driver circuitry configured to provide independent voltages to one or more of p-contact layers. In one or more embodiments, the electronic system is selected from the group consisting of a LED-based luminaire, a light emitting strip, a light emitting sheet, an optical display, and a microLED display.

Figure 4:
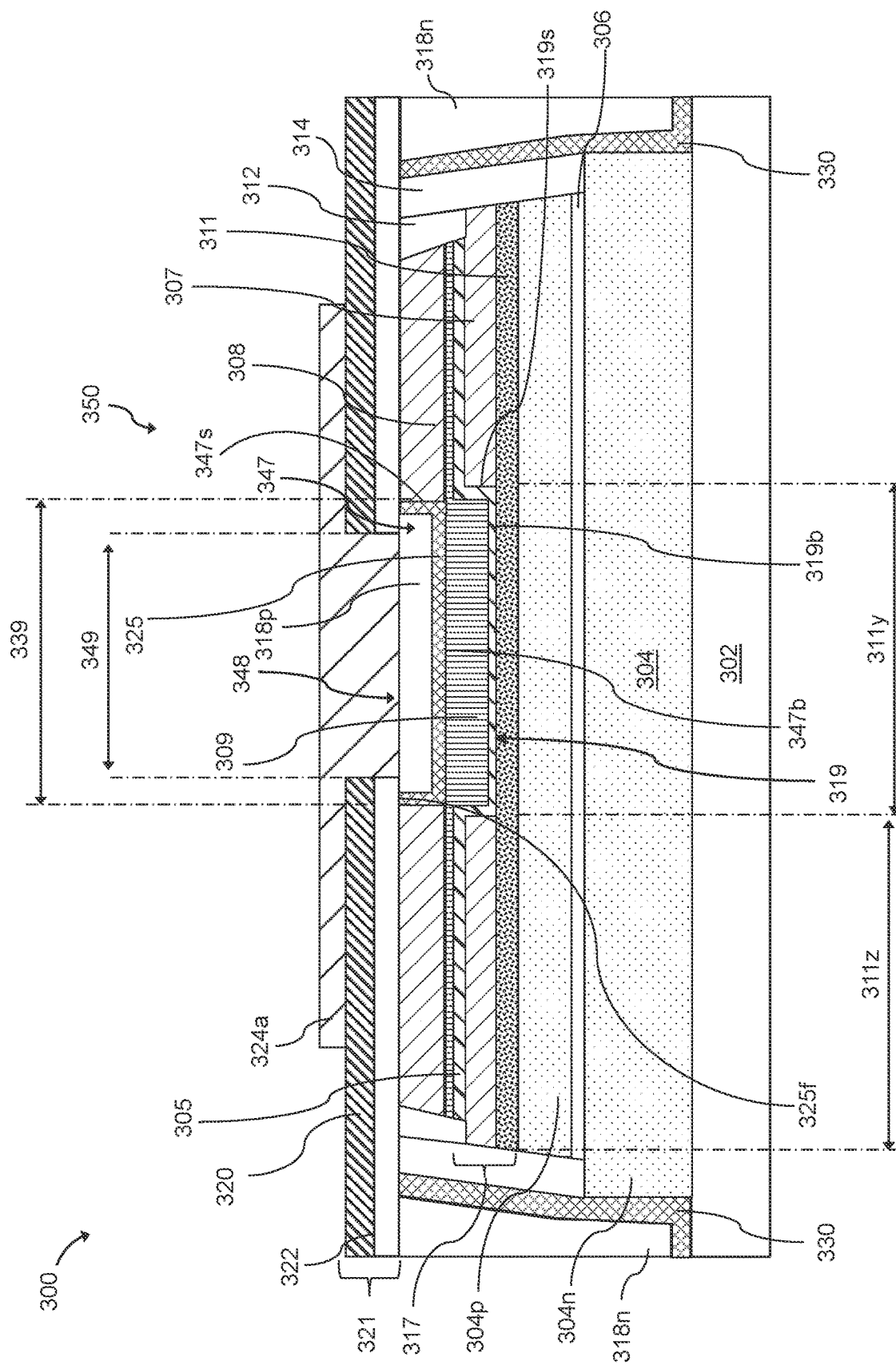
FIG. 4 illustrates a cross-sectional view of a LED device according to one or more embodiments.

FIG. 4 is a cross sectional view of an LED device 300 showing a single mesa 350 of an LED device according to one or more embodiments. The device 300 is similar to the first mesa 150a or the second mesa 150b of the device 100 shown in FIG. 1O. The device 300 comprises a semiconductor layer 304 including an n-type layer 304n, a p-type layer 304p and an active region 306 between the n-type layer 304n and the p-type layer 304p.

In the embodiment shown, there is a multilayer composite film 317 on the P-type layer 304p. As shown, the multilayer composite film 317 comprises a current spreading layer 311 on the P-type layer 304p. The multilayer composite film further comprises a dielectric layer 307 on the current spreading layer 311. In one or more embodiments, the current spreading layer 311 has a first portion 311y and a second portion 311z. The first portion 311y and the second portion 311z are lateral portions of the current spreading layer 311. A P-contact layer 305 is on the first portion 311y of the current spreading layer 311 and in a via opening 319. The dielectric layer 307 is on the second portion 311z of the current spreading layer 311. In one or more embodiments, the dielectric layer 307 is separated by the via opening 319. The via opening 319 has at least one sidewall 319s and a bottom 319b, the bottom 319b exposing the current spreading layer 311. In the embodiment shown, the via opening 319 is defined by opposing sidewalls 319s of the dielectric layer 307 and a bottom 319b defined by the current spreading layer 311. In the embodiment illustrated in FIG. 4, the via opening 319 is filled with a P-contact layer 305 and a guard layer 309. As shown in FIG. 4, the P-contact layer 305 is directly on the top surface of the dielectric layer 307, on the sidewalls 319s and the bottom 319b of the via opening 319, and on the first portion 311y of the current spreading layer 311. As shown in the embodiment of FIG. 4, the P-contact layer 305 is substantially conformal to the via opening 319. As used herein, a layer which is "substantially conformal" refers to a layer where the thickness is about the same throughout (e.g., on the hard mask layer 308, on the sidewalls 319s and on the bottom 319b of the via opening 319). A layer which is substantially conformal varies in thickness by less than or equal to about 5%, 2%, 1% or 0.5%. In one or more embodiments, a guard layer 309 is on the P-contact layer 305. Without intending to be bound by theory, according to one or more embodiments, the guard layer 309 may prevent metal ions from the P-contact layer 305 from migrating and shorting the device 300. In one or more embodiments, the guard layer 309 covers P-contact layer 305 in its entirety. In one or more embodiments, the guard layer 309 directly covers P-contact layer 305 in its entirety.

In one or more embodiments, the current spreading layer comprises a transparent material. The current spreading layer is separate from a reflecting layer. In this way, the function of current spreading is achieved in a different layer from the function of reflection. In one or more embodiments, the current spreading layer 311 comprises indium tin oxide (ITO) or other suitable conducting, transparent materials, e.g., transparent conductive oxides (TCO), such as indium zinc oxide (IZO), the current spreading layer 311 having a thickness in a range of from 5 nm to 100 nm. In some embodiments, the dielectric layer 307 comprises any suitable dielectric material, for example, silicon dioxide ($SiO_2$) or silicon oxynitride (SiON). The guard layer 309, in some embodiments, comprises titanium-platinum (TiPt), titanium-tungsten (TiW), or titanium-tungsten nitride (TiWN). In one or more embodiments, the P-contact layer 305 comprises a reflective metal. In one or more embodiments, the P-contact layer 305 comprises any suitable reflective material such as, but not limited to, nickel (Ni) or silver (Ag).

Without intending to be bound by theory, according to some embodiments, the multilayer composite film 317 on the P-type layer 304p may balance absorption, reflection, and conductivity. In some embodiments, the P-contact layer 305 is a highly reflective layer. At angles close to and larger than the critical angle, the dielectric layer 307 is a better reflector than P-contact layer 305 and may not be particularly conductive. In some embodiments, the dielectric layer 307 may be composed of multiple dielectric layers to form a DBR (distributed Bragg reflector). In one or more embodiments, the current spreading layer 311 is optimized to minimize absorption and increase conductivity.

In one or more embodiments, the P-contact layer 305 spans a width of the mesa that is smaller than a width that the current spreading layer 311 spans.

In the embodiment shown, there is a hard mask layer 308 on a first section of the guard layer 309, which is above the second portion 311z of the current spreading layer 311, the hard mask layer 308 having a hard mask opening 347 defined therein. The hard mask layer 308 may comprise any suitable material, including a dielectric material. The hard mask layer 308 has been masked and etched as described with respect to FIGS. 1A-N above.

The hard mask opening 347 is partially filled with a liner layer 325 and partially filled with a P-metal material plug 318p, the P-metal material plug 318p having a width 339. As shown in the embodiment of FIG. 4, the liner layer 325 is substantially conformal to the hard mask opening 347. As used herein, a layer which is "substantially conformal" refers to a layer where the thickness is about the same throughout (e.g., on the sidewalls 347s and on the bottom 347b of the hard mask opening 347). A layer which is substantially conformal varies in thickness by less than or equal to about 5%, 2%, 1% or 0.5%. In one or more embodiments, the hard mask opening 347 has at least one sidewall 347s and a bottom surface 347b. In some embodiments, the bottom surface 347b exposes the guard layer 309. In one or more embodiments, the liner layer 325 is on the at least one sidewall 347s and the bottom 347b of the hard mask opening 347. In specific embodiments, the liner layer 325 is substantially conformal to the at last one sidewall 347s and the bottom 347b of the hard mask opening 347. In the embodiment shown, there are two sidewalls 347s, which are opposed sidewalls 347s defining the hard mask opening 347. In one or more embodiments, the liner layer 325 has a thickness in a range of from about 5 nm to about 2 um. In one or more embodiments, the liner layer 325 may comprise a seed material and the liner layer 325 can comprise any suitable material including, but not limited to, aluminum (Al), titanium nitride, Ag, indium tin oxide (ITO), titanium tungsten (TiW) and/or titanium platinum (TiP). The seed material of the liner layer 325 according to some embodiments may promote plating of the P-metal material plug 318p. In one or more embodiments, the liner layer 325 serves as an electrical bridge. The liner layer 325 may be formed by any means known to one of skill in the art such as sputtering deposition.

As illustrated in FIG. 4, there is a passivation film 321 on the hard mask layer 308. In one or more embodiments, the passivation film 321 comprises a first passivation layer 320 and a second passivation layer 322. The first passivation layer 320 and the second passivation layer 322 can comprise any suitable material. In one or more embodiments, the first passivation layer 320 comprises silicon oxide ($SiO_2$), and the second passivation layer comprises silicon nitride (SiN). In one or more embodiments, the passivation film 321 has a passivation film opening 348 therein defining a width 349, the width 349 of the passivation film opening 348 being less than the width 339 of a combination of the P-metal material plug 318p and the liner layer 325. In one or more embodiments, the passivation film 321 is sized to cover a surface 325f of the liner layer 325 and a portion of the P-metal material plug 318p. In this way, the passivation film opening 348 being less than the width 339 of the P-metal material plug 318p and liner layer 325 is effective to protect the liner layer 325 while allowing access to the P-metal material plug 318p. In one or more embodiments, each the passivation film opening 348 is centered to the P-metal material plug 318p.

As shown in FIG. 4, a layer of P-metal material, which may also be referred to as a P-metal material plug 318p, is formed on the liner layer 325. The P-metal material plug 318p can comprise any suitable material. In one or more embodiments, the P-metal material plug 318p comprises copper (Cu). In one or more embodiments, the inner spacers 312 contact the outer edges of the P-contact layer 305, the guard layer 309, and the hard mask layer 308. Outer spacers 314 are formed adjacent the inner spacers 312.

In one or more embodiments, a reflective liner 330 is formed at the ends of the semiconductor layers 304n, 306, and 304p, separating them from N-contact material 318n. A difference between the LED device 300 in FIG. 4 and that shown in FIG. 1O is the first passivation layer 320 corresponding to the passivation layer 120 shown in FIG. 1M, and a second passivation layer 322, which may comprise silicon nitride (SiN) in some embodiments. In some embodiments, there is only the first passivation layer 320, but in other embodiments, there is the first passivation layer 320 and the second passivation layer 322. The first passivation layer 320 and the second passivation layer 322 have a passivation film opening 348 therein. In FIG. 4, there is also an anode pad comprising under bump metallization 324a, the composition of which is described with respect to FIG. 1M. The P-metal material plug 318p has a width 339 defined by the distance from the outer edges of liner layer 325, and the passivation film opening 348 in the passivation layers is filled with the under bump metallization 324a, which forms the anode pad. In one or more embodiments, the opening 348 has a width 349 that is less than the width 339 of the P-metal material plug 318p. In some embodiments, the width of the P-metal material plug 318p is in a range of from 2 μm to 30 μm, for example from 10 μm to 20 μm.

Applications

LED devices disclosed herein may be monolithic arrays or matrixes. An LED device may be affixed to a backplane for use in a final application. Illumination arrays and lens systems may incorporate LED devices disclosed herein.

Applications include but are not limited to beam steering or other applications that benefit from fine-grained intensity, spatial, and temporal control of light distribution. These applications may include, but are not limited to, precise spatial patterning of emitted light from pixel blocks or individual pixels. Depending on the application, emitted light may be spectrally distinct, adaptive over time, and/or environmentally responsive. Light emitting pixel arrays may provide pre-programmed light distribution in various intensity, spatial, or temporal patterns. Associated optics may be distinct at a pixel, pixel block, or device level. An example light emitting pixel array may include a device having a commonly controlled central block of high intensity pixels with an associated common optic, whereas edge pixels may have individual optics. In addition to flashlights, common applications supported by light emitting pixel arrays include video lighting, automotive headlights, architectural and area illumination, and street lighting.

The use of the terms "a" and "an" and "the" and similar referents in the context of describing the materials and methods discussed herein (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the materials and methods and does not pose a limitation on the scope unless otherwise claimed. No language in the specification should be construed as indicating any non-claimed element as essential to the practice of the disclosed materials and methods.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. In one or more embodiments, the particular features, structures, materials, or characteristics are combined in any suitable manner.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A light emitting diode (LED) device comprising:
    a plurality of mesas defining pixels, each of the mesas comprising semiconductor layers, the semiconductor layers including an N-type layer, an active region, and a P-type layer, each of the mesas having a height less than or equal to their width;
    an N-contact material in a space between each of the mesas, the N-contact material providing optical isolation between each of the mesas, and electrically contacting the N-type layer of each of the mesas along sidewalls of the N-type layers;
    a dielectric material which insulates sidewalls of the P-type layer and the active region from the N-contact material; and
    a multilayer composite film on the P-type layer, the multilayer composite film comprising: a current spreading layer on the P-type layer, the current spreading layer having a first portion and a second portion; a dielectric layer on the second portion of the current spreading layer; a via opening defined by sidewalls in the dielectric layer and the first portion of the current spreading layer; and a P-contact layer conformal to the via opening on the first portion of the current spreading layer, the sidewalls in the dielectric layer, and on at least a portion of the dielectric layer; wherein the multilayer composite film further comprises a guard layer in the via opening and above the dielectric layer on the second portion of the current spreading layer covering the P-contact layer.

2. The LED device of claim 1, wherein the P-contact layer comprises a reflective metal, and the current spreading layer comprises a transparent material.

3. The LED device of claim 2, wherein the plurality of mesas comprises an array of mesas.

4. The LED device of claim 1, wherein the current spreading layer comprises a transparent conductive oxide (TCO).

5. The LED device of claim 4, wherein the current spreading layer comprises indium tin oxide (ITO) or indium zinc oxide (IZO).

6. The LED device of claim 1, wherein the P-contact layer comprises one or more of nickel (Ni) and silver (Ag), and the dielectric layer comprises silicon dioxide ($SiO_2$).

7. The LED device of claim 1, wherein the guard layer comprises one or more of titanium-platinum (TiPt), titanium-tungsten (TiW) and titanium-tungsten nitride (TiWN).

8. The LED device of claim 1, wherein the semiconductor layers have a thickness in a range of from 2 μm to 10 μm.

9. The LED device of claim 1, wherein the dielectric material is in a form of outer spacers comprising a material selected from the group consisting of $SiO_2$, $AlO_x$, and SiN, having a thickness in a range of from 200 nm to 1 μm.

10. The LED device of claim 1, wherein the space between each of the mesas comprises a trench having a depth from a top surface of each of the mesas in a range of from 0.5 μm to 2 μm.

11. The LED device of claim 1, wherein each of the mesas includes sidewalls of the semiconductor layers, each having a first segment and a second segment, wherein the first segments of the sidewalls define an angle in a range of from 60 degrees to 90 degrees from a horizontal plane that is parallel with the N-type layer and the P-type layer; and the second segments of the sidewalls form an angle with a top surface of a substrate upon which the mesas are formed in a range of from 75 to less than 90 degrees.

12. The LED device of claim 1 further comprising a P-metal material plug in a hard mask opening above a portion of the guard layer in the via opening and an under bump metallization layer in contact with the P-metal plug.

13. The LED device of claim 1, wherein the P-contact layer varies in thickness by less than or equal to 5%.

14. A light emitting diode (LED) device comprising:
a plurality of mesas defining pixels, each of the mesas comprising semiconductor layers, the semiconductor layers including an N-type layer, an active region, and a P-type layer, each of the mesas having a height less than or equal to their width;
an N-contact material in a space between each of the mesas, the N-contact material providing optical isolation between each of the mesas, and electrically contacting the N-type layer of each of the mesas along sidewalls of the N-type layers;
a dielectric material which insulates sidewalls of the P-type layer and the active region from the N-contact material;
a multilayer composite film on the P-type layer, the multilayer composite film comprising: a current spreading layer having a first portion and a second portion directly on the P-type layer, a dielectric layer on the second portion of the current spreading layer, the dielectric layer comprising sidewalls that with the first portion of the current spreading layer defining a via opening, and a P-contact layer conformal to the dielectric layer and the via opening; the multilayer composite film further comprises a guard layer in the via opening and above the dielectric layer on the second portion of the current spreading layer covering the P-contact layer;
a hard mask layer above the P-contact layer that is above the second portion of the current spreading layer, the hard mask layer comprising sidewalls defining a hard mask opening;
a liner layer conformally-deposited in the hard mask opening above the P-contact layer that is above the first portion of the current spreading layer and on the sidewalls of the hard mask layer;
a P-metal material plug on the liner layer;
a passivation layer on the hard mask layer; and
an under bump metallization layer on the passivation layer.

* * * * *